US009478285B2

(12) United States Patent
Park et al.

(10) Patent No.: US 9,478,285 B2
(45) Date of Patent: Oct. 25, 2016

(54) CROSS-POINT MEMORY DEVICE INCLUDING MULTI-LEVEL CELLS AND OPERATING METHOD THEREOF

(71) Applicants: Hyun-Kook Park, Anyang-Si (KR); Chi-Weon Yoon, Seoul (KR); Dae-Seok Byeon, Seongnam-Si (KR)

(72) Inventors: Hyun-Kook Park, Anyang-Si (KR); Chi-Weon Yoon, Seoul (KR); Dae-Seok Byeon, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/800,060

(22) Filed: Jul. 15, 2015

(65) Prior Publication Data

US 2016/0148678 A1 May 26, 2016

(30) Foreign Application Priority Data

Nov. 24, 2014 (KR) ........................ 10-2014-0164414

(51) Int. Cl.
*G11C 11/00* (2006.01)
*G11C 13/00* (2006.01)
*G11C 11/56* (2006.01)
*G11C 11/16* (2006.01)

(52) U.S. Cl.
CPC ......... *G11C 13/004* (2013.01); *G11C 11/1673* (2013.01); *G11C 11/56* (2013.01); *G11C 11/5607* (2013.01); *G11C 11/5642* (2013.01); *G11C 13/0002* (2013.01); *G11C 2013/0054* (2013.01); *G11C 2213/71* (2013.01)

(58) Field of Classification Search
CPC .......... G11C 11/4074; G11C 11/4076; G11C 11/4091; G11C 2207/2227; G11C 5/14; G11C 16/0483; G11C 16/26
USPC ................ 365/149, 185.03, 185.13, 185.18, 365/185.21, 185.23, 185.24, 189.11, 203, 365/226, 227

See application file for complete search history.

(56) References Cited

U.S. PATENT DOCUMENTS

| 7,830,705 | B2 | 11/2010 | Jeong |
| 8,081,501 | B2 | 12/2011 | Choi et al. |
| 8,081,518 | B2 * | 12/2011 | Tanaka ............... G11C 16/26 365/185.03 |
| 8,213,215 | B2 | 7/2012 | Chen et al. |
| 8,416,614 | B2 | 4/2013 | Chen et al. |
| 8,493,770 | B2 | 7/2013 | Hosono et al. |
| 8,625,326 | B2 | 1/2014 | Hosono |
| 2013/0163321 | A1 | 6/2013 | Lam et al. |
| 2013/0194865 | A1 | 8/2013 | Bandic et al. |

(Continued)

OTHER PUBLICATIONS

Yu, Shimeng et al., "On the Stochastic Nature of Resistive Switching in Metal Oxide RRAM: Physical Modeling, Monte Carlo simulation, and Experimental Charaterization," 2011 IEEE, IEDM11-413-416.

*Primary Examiner* — Thong Q Le
(74) *Attorney, Agent, or Firm* — Volentine & Whitt, PLLC

(57) ABSTRACT

A method of operating a cross-point memory device, having an array of multilevel cells, includes performing a first reading operation with respect to the multilevel cells through a plurality of sensing operations to determine a first state and performing a second reading operation with respect to the multilevel cells through a plurality of sensing operations to determine a second state. A difference between a level of a first voltage used in a first sensing operation and a level of a second voltage used in a second sensing operation in the first reading operation is different from a difference between a level of a third voltage used in a first sensing operation and a level of a fourth voltage used in a second sensing operation in the second reading operation.

20 Claims, 25 Drawing Sheets

(56) References Cited

U.S. PATENT DOCUMENTS

2013/0265820 A1 10/2013 Chih et al.
2014/0063904 A1 3/2014 Yon
2014/0119094 A1 5/2014 Lee et al.
2014/0177322 A1 6/2014 Kwon et al.

* cited by examiner

CROSS-POINT MEMORY DEVICE INCLUDING MULTI-LEVEL CELLS AND OPERATING METHOD THEREOF

CROSS-REFERENCE TO RELATED APPLICATION

This application claims the benefit of Korean Patent Application No. 10-2014-0164414, filed on Nov. 24, 2014, in the Korean Intellectual Property Office, the disclosure of which is incorporated herein in its entirety by reference.

BACKGROUND

The disclosure relates to a cross-point memory device including multi-level cells, and more particularly, to a cross-point memory device including multi-level cells and an operating method thereof.

According to demands for high capacity and low power of memory devices, next generation memory devices that are nonvolatile and do not need to be refreshed have been studied. Such a next generation memory device may have a high integration of a dynamic random access memory (DRAM), a nonvolatile characteristic of a flash memory, a high speed of a static RAM (SRAM), etc. A phase change RAM (PRAM), a nano floating gate memory (NFGM), a polymer RAM (PoRAM), a magnetic RAM (MRAM), a ferroelectric RAM (FeRAM), a resistive RAM (RRAM), etc. are mentioned as next generation memory devices.

SUMMARY

The disclosure describes a cross-point memory device including multi-level cells having improved read performances and an operating method thereof.

According to an aspect of the disclosure, there is provided a method of operating a cross-point memory device including a memory cell array including multilevel cells, the method including: performing a first reading operation with respect to the multilevel cells through a plurality of sensing operations to determine a first state; and performing a second reading operation with respect to the multilevel cells through a plurality of sensing operations to determine a second state. A difference between a level of a first voltage used in a first sensing operation and a level of a second voltage used in a second sensing operation in the first reading operation may be different from a difference between a level of a third voltage used in a first sensing operation and a level of a fourth voltage used in a second sensing operation in the second reading operation.

According to another aspect of the disclosure, there is provided a method of operating a cross-point memory device including a memory cell array including multilevel cells, the method including: performing a first sensing operation with respect to a plurality of multilevel cells by using a read factor instructing a first target resistance to determine a first state; performing a second sensing operation with respect to one or more multilevel cells by using a read factor instructing a second target resistance to determine the first state; performing a third sensing operation with respect to a plurality of multilevel cells by using a read factor instructing a third target resistance to determine a second state; and performing a fourth sensing operation with respect to one or more multilevel cells by using a read factor instructing a fourth target resistance to determine the second state. A first resistance difference between the first and second target resistances may be different from a second resistance difference between the third and fourth target resistances.

According to another aspect of the disclosure, there is provided a method of operating a memory system including a cross-point memory device and a memory controller, the method including: setting first and second read conditions used in a first reading operation for determining a first state; and setting third and fourth read conditions used in a second reading operation for determining a second state. A first variation corresponding to a difference between a value of a read factor of the first read condition and a value of a read factor of the second read condition may be different from a second variation corresponding to a difference between a value of a read factor of the third read condition and a value of a read factor of the fourth read condition.

According to another aspect of the disclosure, there is provided a cross-point memory device including: a memory cell array that includes multilevel cells arrayed in an area where a plurality of first lines cross a plurality of second lines; a write and/or read circuit that performs writing and reading operations with respect to the multilevel cells; and a control logic that controls to perform a plurality of sensing operations to determine a first state and perform a plurality of sensing operations to determine a second state in a reading operation performed with respect to the multilevel cells. A difference between a level of a first voltage used in a first sensing operation for determining the first state and a level of a second voltage used in a second sensing operation may be different from a difference between a level of a third voltage used in a first sensing operation for determining the second state and a level of a fourth voltage used in a second sensing operation.

According to another aspect of the disclosure, there is provided a method, executed by a memory controller, of reading data from a nonvolatile memory having a group of multilevel cells that are addressed by a plurality of signal lines, each of the memory cells capable of being programmed to any of multiple resistive states. The method includes characterizing the group of memory cells as one or more comparison memory cells and performing the set of operations (a) through (d) for each of N iterations: a) performing the set of operations (b) through (d) for each of I iterations: b) comparing the resistance value of each of the one or more comparison memory cells to an Ith reference value of an Nth resistive state, c) identifying, based upon the outcome(s) of the comparison(s) of operation (b), memory cells not having the Nth resistive state based upon the comparison outcome(s) of operation (a), and d) re-characterizing, as the one or more comparison memory cells, the memory cells identified in operation (c). N and I are integers greater than one. For each first resistive state among the N resistive states having a greater characteristic resistance than a second resistive state among the N resistive states, the magnitude of the difference between each pair of the I reference values applied for the comparisons with respect to the first resistive state is greater than the magnitude of the difference between each pair of the I reference values applied for the comparisons with respect to the second resistive state.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

Figure 1:
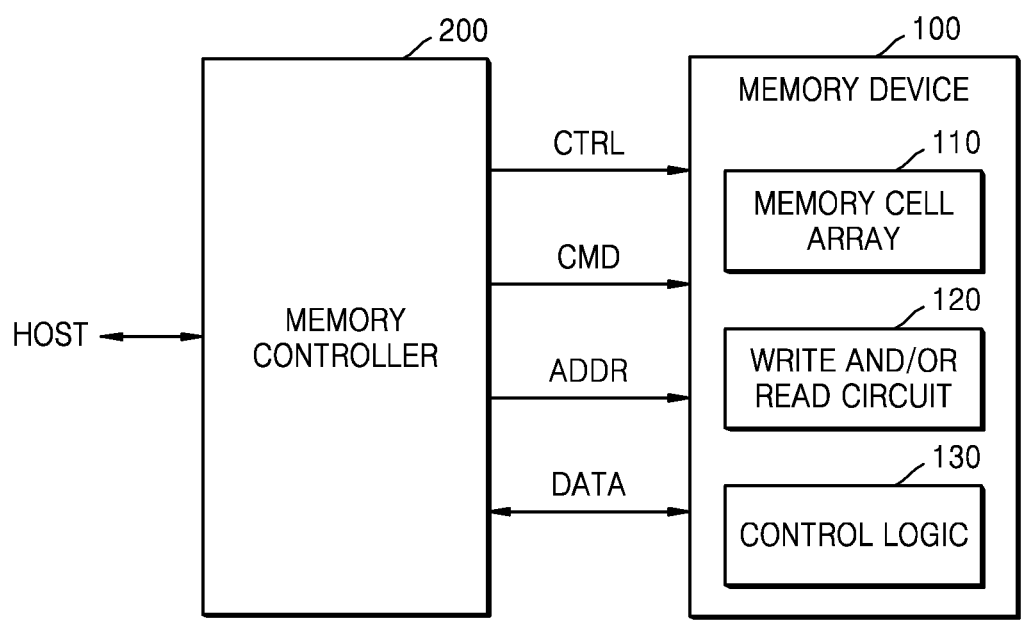
FIG. 1 is a block diagram illustrating a memory system including a memory device according to an exemplary embodiment of the disclosure.

As used herein, the term "and/or" includes any and all combinations of one or more of the associated listed items. Expressions such as "at least one of," when preceding a list of elements, modify the entire list of elements and do not modify the individual elements of the list.

The disclosure will now be described more fully with reference to the accompanying drawings, in which exemplary embodiments of the disclosure are shown. The disclosure may, however, be embodied in many different forms and should not be construed as being limited to the exemplary embodiments set forth herein; rather, these exemplary embodiments are provided so that this disclosure will be thorough and complete, and will fully convey the disclosure to those skilled in the art. In the drawings, the thicknesses of layers and regions are exaggerated for clarity. Like reference numerals in the drawings denote like elements, and thus their description will be omitted.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system 10 including a memory device 100 according to an exemplary embodiment of the disclosure. In the present exemplary embodiment, the memory device 100 includes resistive memory cells and thus may be referred to as a resistive memory device. Alternatively, the memory device 100 may include various types of memory cells, and the memory cells may be arrayed in an area where a plurality of first signal lines cross a plurality of second signal lines. Therefore, the memory device 100 may be referred to as a cross-point memory device. In exemplary embodiments of the disclosure that will be described hereinafter, the memory device 100 will be referred to as a cross-point memory device including resistive memory cells.

Referring to FIG. 1, the memory system 10 includes the memory device 100 and a memory controller 200. The memory device 100 may include a memory cell array 110, a write/read circuit 120, and a control logic 130. If the memory cell array 110 includes resistive memory cells, the memory system 10 may be referred to as a resistive memory system.

The memory controller 200 may control the memory device 100 to respond to a write and/or read request of a host so as to read data from the memory device 100 or write data onto the memory device 100. In detail, the memory controller 200 may provide an address ADDR, a command CMD, and a control signal CTRL to the memory device 100 to control programming (or writing), reading, and erasing operations that are performed with respect to the memory device 100. Data DATA to be written and read data DATA may be transmitted and received between the memory controller 200 and the memory device 100.

Although not shown in FIG. 1, the memory controller 200 may include a random access memory (RAM), a processing unit, a host interface, and a memory interface. The RAM may be used as an operation memory of the processing unit. The processing unit may control an operation of the memory controller 200. The host interface may include a protocol for exchanging data between the host and the memory controller 200. For example, the memory controller 200 may be configured to communicate with the host through at least one selected from various types of interface protocols, such as a universal serial bus (USB), an multimedia card (MMC), peripheral component interconnect-Express (PCI-E), advanced technology attachment (ATA), serial-ATA, parallel-ATA, a small computer system interface (SCSI), European security and defense identity (ESDI), integrated drive electronics (IDE), etc.

The memory cell array 110 may include a plurality of memory cells (not shown) that are respectively arrayed in an area in which a plurality of first signal lines cross a plurality of second signal lines. According to an exemplary embodiment, the plurality of first signal lines may be a plurality of bitlines, and the plurality of second signal lines may be a plurality of wordlines. According to another exemplary embodiment, the plurality of first signal lines may be a plurality of wordlines, and the plurality of second signal lines may be a plurality of bitlines.

Each of the plurality of memory cells may be a single level cell (SLC) that stores 1 bit or a multi-level cell (MLC) that may store data of at least 2 or more bits. Alternatively, the memory cell array 110 may include SLCs and MLCs. If 1 bit data is written in one memory cell, memory cells may have 2 resistance level dispersions according to the written data. Alternatively, if data of 2 bits is written in one memory cell, memory cells may have 4 resistance level dispersions according to the written data. According to another exemplary embodiment, in case of a triple level cell (TLC) where data of 3 bits is written in one memory cell, memory cells may have 8 resistance level dispersions according to the written data. However, the disclosure is not limited thereto, and thus memory cells may include memory cells, each of which may store data of 4 or more bits according to another exemplary embodiment.

According to an exemplary embodiment, the memory cell array 110 may include memory cells having 2-dimensional (2D) horizontal structures. According to another exemplary embodiment, the memory cell array 110 may include memory cells having 3-dimensional (3D) vertical structures.

The memory cell array 110 may include resistive memory cells having variable resistor elements (not shown). For example, if the variable resistor elements are formed of a phase-change material (GST, Ge—Sb—Te, or the like), and thus resistances of the variable resistor elements change, a resistive memory device may be a phase-change RAM (PRAM). As another example, if the variable resistor elements include upper electrodes, lower electrodes, and complex metal oxides formed between the upper and lower electrodes, the resistive memory device may be a resistive RAM (RRAM). As another example, if the variable resistor elements include upper electrodes, lower electrodes formed of magnetic materials, and dielectrics formed between the upper electrodes and the lower electrodes, the resistive memory device may be a magnetic RAM (MRAM).

The write/read circuit 120 performs writing and reading operations with respect to the memory cells. The write/read circuit 120 may be connected to the memory cells through a plurality of bitlines and include a write driver for writing data in the memory cells and a sense amplifier for sensing resistance components of the memory cells.

The control logic 130 may control an overall operation of the memory device 100 and may control the write/read circuit 120 to perform memory operations such as writing and reading, etc. For example, the memory device 100 may include a power generator (not shown) that generates various types of write and read voltages used for writing and reading operations, and levels of the write and read voltages may be adjusted under control of the control logic 130. As an example, the memory device 100 may include a reference signal generator (not shown) that generates various types of reference signals used for reading operations. For example, the reference signal generator may generate a reference current and/or a reference voltage. Levels of the reference current and/or the reference voltage may be adjusted under control of the control logic 130.

In a writing operation performed with respect to the memory device 100, values of variable resistances of the memory cells of the memory cell array 110 may increase or decrease according to data that is to be written. For example, the memory cells of the memory cell array 110 may respectively have resistance values that depend on currently stored data, and the resistance values may increase or decrease according to data that is to be written in the memory cells. The above-described writing operation may be classified into a reset writing operation and a set writing operation. In the resistive memory cells, set states may have relatively low resistance values, and reset states may have relatively high resistance values.

A reading operation may be performed with respect to the memory device 100 according to various reading methods. In each of the reading methods, a reading operation may be performed by one or more read factors. If the reading methods are different from each other, different read factors may be used for the reading operation. For example, a current sensing method may include a reference current and a reference voltage as read factors, apply the reference current to a selected memory cell, and compare a voltage of a sensing node caused by the reference current with the reference voltage to determine data. Alternatively, a voltage sensing method may include a pre-charge voltage and a reference voltage as read factors, and a sensing node may be pre-charged on a preset level. Thereafter, a voltage level of the sensing node may decrease due to a current flowing through a selected memory cell, and a voltage of the sensing node may be compared with the reference voltage at a preset sensing time to determine data.

If each of MLCs stores data of 2 bits, three reading operations may be performed to read an MLC having 4 resistance level distributions (or 4 states). A first reading operation may be performed to determine a first state and a second state (stated differently, to distinguish the first and second states from each other). A second reading operation may be performed to determine the second state and a third state (stated differently, to distinguish the second and third states from each other). A third reading operation may be performed to determine the third state and a fourth state (stated differently, to distinguish the third and fourth states from each other).

Values of one or more read factors may be set in each reading operation to determine respective states. For example, in the first reading operation, the value of the read factor may be set to a target resistance corresponding to a value between the first and second states. Also, in the second reading operation, the value of the read factor may be set to a target resistance corresponding to a value between the second and third states. In the third reading operation, the value of the read factor may be set to a target resistance corresponding to a value between the third and fourth states. In each reading operation, a resistance value of a memory cell may be compared with a target resistance value to determine whether the corresponding memory cell has a high or low resistance.

According to an exemplary embodiment of the disclosure, the write/read circuit 120 performs at least two sensing operations to determine one state when performing reading operations with respect to MLCs. Also, in each of the sensing operations, a value of at least one read factor may be controlled to be changed. For example, coarse sensing may be performed by using a read factor (e.g., a bitline voltage) having a first value to determine a first state, and then the read factor may be changed into a second value to perform fine sensing. Similarly to this, a plurality of sensing operations may be performed to determine a second state, and a plurality of sensing operations may be performed to determine a third state.

According to an exemplary embodiment of the disclosure, a variation in a value of a read factor of a reading operation for determining one state may be set to be different from a variation in a value of a read factor of a reading operation for determining another state. Also, in a plurality of sensing operations performed in respective reading operations, variations in values of read factors may be adjusted by reflecting a characteristic of a threshold voltage distribution.

For example, if a first sensing operation using a read factor having a first value and a second sensing operation using a read factor having a second value are sequentially performed in a first reading operation, a difference value between the first and second values may be defined as a first variation. Also, if a first sensing operation using a read factor having a third value and a second sensing operation using a read factor having a fourth value are sequentially performed in a second reading operation, a difference value between the third and fourth values may be defined as a second variation. Here, the first and second variations may be different from each other, for example, the first variation may be smaller than the second variation. As to an example of a bitline voltage, when a first bitline voltage and a second bitline voltage are used in a first reading operation, and a third bitline voltage and a fourth bitline voltage are used in a second reading operation, a level difference between the first and second bitline voltages may be lower than a level difference between the third and fourth bitline voltages.

Information about values of read factors depending on respective sensing operations may be pre-stored in or outside the control logic 130, and the control logic 130 may control the values of the read factors to be changed with reference to the information. A set of values of various types of read factors of respective sensing operations may be defined as a read condition, and thus read conditions of a plurality of sensing operations may be different from one another in one reading operation.

The memory device 100 and the memory controller 200 may be integrated into one semiconductor device. Exemplarily, the memory device 100 and the memory controller 200 may be integrated into one semiconductor device to configure a memory card. For example, the memory device 100 and the memory controller 200 may be integrated into one semiconductor device to configure a PC card (PCM-CIA), a compact flash card (CF), a smart media card (SM/SMC), a memory stick, a multimedia card (MMC: RS-MMC, MMCmicro), a secure digital (SD) card (miniSD, microSD), a universal flash storage (UFS), etc. As another example, the memory device 100 and the memory controller 200 may be integrated into one semiconductor device to configure a solid state disk and/or drive (SSD).

According to an exemplary embodiment of the disclosure as described above, a deterioration in a read performance, which may occur when reading operations are simultaneously performed with respect to a plurality of memory cells, may be improved. For example, when a plurality of memory cells that are commonly connected to one wordline are simultaneously selected, and the selected memory cells include many memory cells having low resistances, a large amount of current flows into the wordline, and thus a voltage level of the wordline may increase. In this case, a difference between voltages applied to both ends of a memory cell may decrease, and thus a read performance may deteriorate. According to an exemplary embodiment of the disclosure, a determination may be made that data is passed from a few memory cells, through a coarse sensing operation. Also, fine sensing operations may be selectively performed with respect to memory cells that are determined as fails. Therefore, a deterioration in a read performance caused by an increase in a voltage level of a wordline may be prevented.

Also, according to an exemplary embodiment of the disclosure, a plurality of sensing operations may be performed in a plurality of states of MLCs, and variations in values of read factors of sensing operations may be set to be different from one another in consideration of dispersion characteristics of the plurality of states. Therefore, a best reading operation may be performed with respect to the MLCs.

A detailed operation of the memory device 100 included in the resistive memory system 10 that may be configured as described above will now be described.

Figure 2:
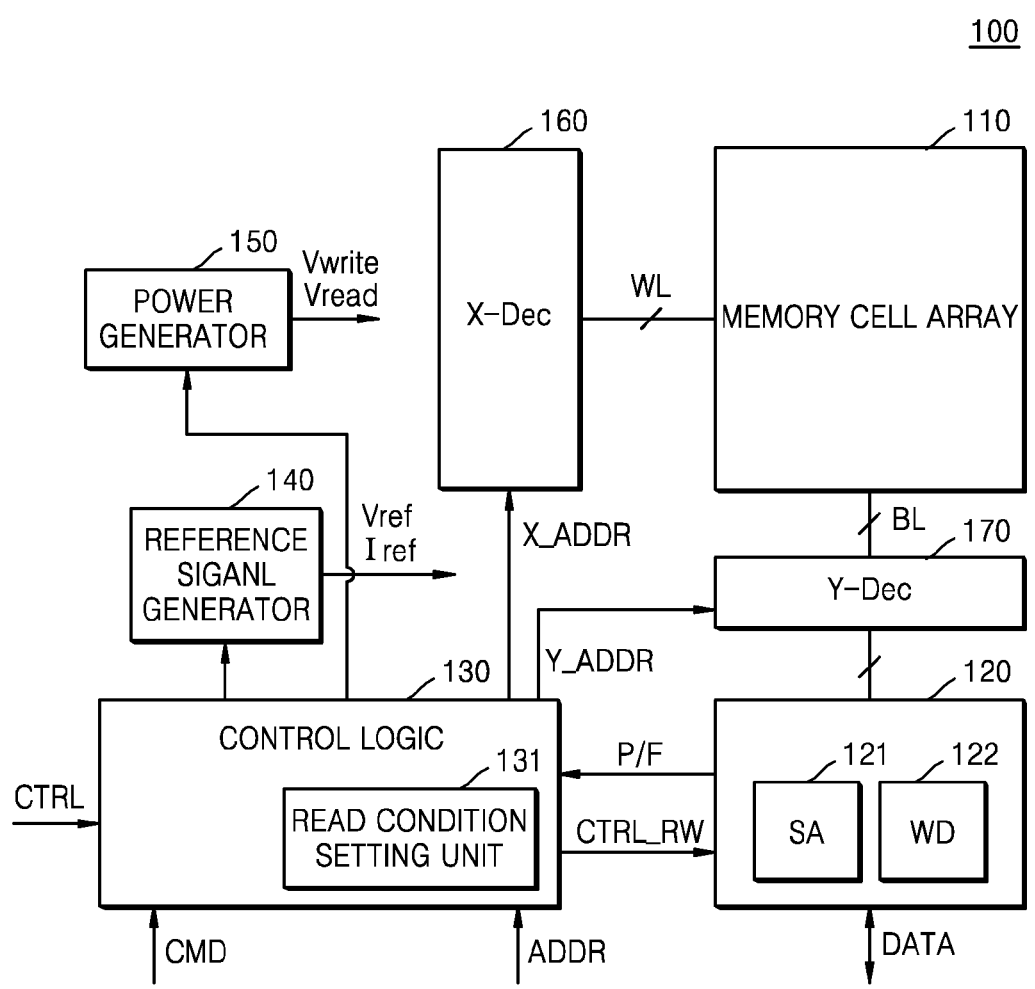
FIG. 2 is a block diagram illustrating a memory device of FIG. 1, according to an exemplary embodiment of the disclosure.

FIG. 2 is a block diagram illustrating the memory device 100 of FIG. 1, according to an exemplary embodiment of the disclosure.

Referring to FIG. 2, the memory device 100 may include the memory cell array 110, the write/read circuit 120, and the control logic 130. The memory device 100 may further include a reference signal generator 140, a power generator 150, a row decoder 160, and a column decoder 170. Also, the write/read circuit 120 may include a sense amplifier (SA) 121 and a write driver (WD) 122. The control logic 130 may include a read condition setter 131.

An operation of the memory device 100 of FIG. 2 will now be described.

Memory cells of the memory cell array 110 may be connected to a plurality of first signal lines and a plurality of second signal lines. The plurality of first signal lines may be bitlines, and the plurality of second signal lines may be wordlines. Various types of voltage signals or current signals may be provided through a plurality of bitlines and a plurality of wordlines. Therefore, data may be written into or read from selected memory cells, and writing or reading may be prevented from being performed with respect to other unselected memory cells.

Along with a command CMD, an address ADDR may be received to instruct a memory cell that is to be accessed and may include a row address X_ADDR for selecting wordlines WL of the memory cell array 110 and a column address (Y_ADDR) for selecting bitlines BL of the memory cell array 110. The row decoder 160 performs a wordline selection operation in response to the row address X_ADDR, and the column decoder 170 performs a bitline selection operation in response to the column address Y_ADDR.

The write/read circuit 120 may be connected to bitlines BL to write data DATA into a memory cell or read data DATA from the memory cell. According to an exemplary embodiment, the power generator 150 may generate a write voltage Vwrite used for a writing operation and a read voltage Vread used for a reading operation. The write voltage Vwrite may include various types of voltages related to the writing operation, such as a set voltage and a reset voltage. Also, the read voltage Vread may include various types of voltages related to the reading operation, such as a bitline voltage, a pre-charge voltage, a clamping voltage, etc. The write voltage Vwrite and the read voltage Vread may be provided to the bitlines BL through the write/read circuit 120 or to the wordlines WL through the row decoder 170.

The reference signal generator 140 may generate various types of signals related to a data reading operation, such as a reference voltage Vref and a reference current Iref. For example, the SA 121 may be connected to a node of a bitline to determine data and compare a voltage of a sensing node with the reference voltage Vref to determine a data value. Alternatively, if a current sensing method is used, the reference signal generator 140 may generate the reference current Iref, provide the reference current Iref to the memory cell array 110, and compare a voltage of the sensing node generated by the reference current Iref with the reference voltage Vref to determine a data value.

The write/read circuit 120 may provide the control logic 130 with a pass/fail (P/F) signal that is generated according to a determination result of read data. The control logic 130 may control writing and reading operations of the memory cell array 110 with reference to the P/F signal.

The control logic 130 may output various types of control signals CTRL_RW for writing data into the memory cell array 110 or reading data from the memory cell array 110, based on the command CMD, the address ADDR, and a control signal CTRL received from the memory controller 200. Therefore, the control logic 130 may control various types of operations of the memory device 100.

According to an exemplary embodiment of the disclosure, read conditions of a plurality of reading operations for determining a plurality of states may be adjusted under control of the control logic 130. Also, read conditions of a plurality of sensing operations performed in one reading operation may be adjusted under control of the control logic 130. The read condition setter 131 may include information related to read conditions that will be used for a plurality of sensing operations of reading operations and control a value of at least one read factor used in the sensing operations to be changed based on the information. Also as described above, a variation in a value of a read factor may be adjusted based on a characteristic of a threshold voltage dispersion of memory cells.

The write/read circuit 120 may simultaneously perform reading with respect to a plurality of memory cells and perform a plurality of sensing operations to determine one state as described above. For example, if a memory cell having a resistance value lower than or equal to a target resistance (e.g., a memory cell in a low resistance state) is determined, a few of memory cells in low resistance states may be determined through a first sensing operation (a coarse sensing operation), and then memory cells in low resistance states may be determined through a second sensing operation (a fine sensing operation). Also, memory cells that are determined to be in low resistance states through the first sensing operation may not be selected in the second sensing operation.

According to an exemplary embodiment of the disclosure, variations in values of read factors may be differently set according to respective states, and thus a reading operation that is optimized for an MLC may be performed. For example, variations in read factors of a plurality of sensing operations performed to determine a first state may have different values from variations in read factors of a plurality of sensing operations performed to determine a second state. Detailed contents related to this will be described later.

Figure 3:
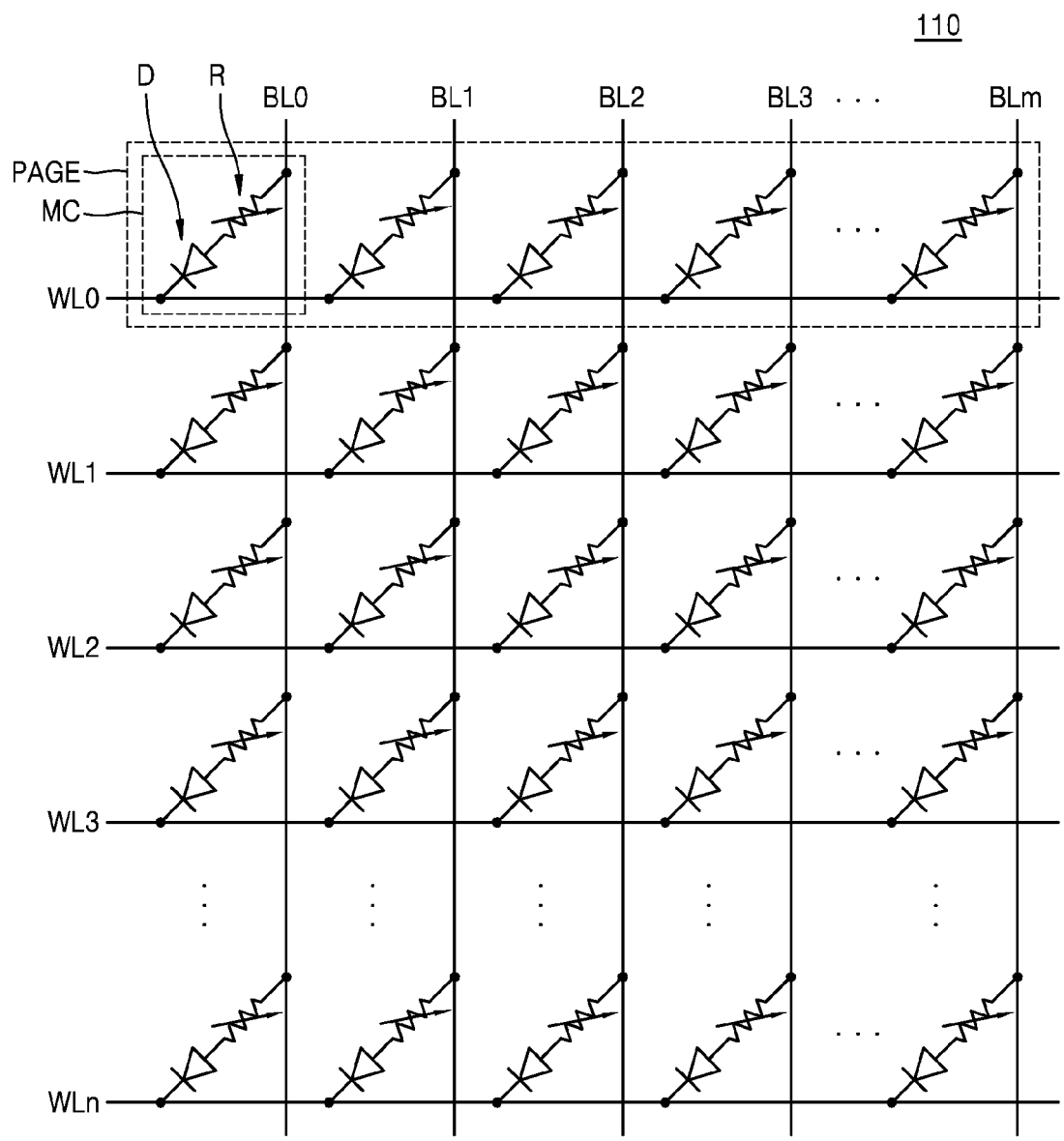
FIG. 3 is a circuit diagram illustrating a memory cell array of FIG. 2, according to an exemplary embodiment of the disclosure.

FIG. 3 is a circuit diagram illustrating the memory cell array 110 of FIG. 2, according to an exemplary embodiment of the disclosure. The memory cell array 110 may include a plurality of cell blocks, and one cell block may be illustrated in FIG. 3.

Referring to FIG. 3, the memory cell array 110 may include a plurality of wordlines WL0 through WLn, a plurality of bitlines BL0 through BLm, and a plurality of memory cells MC. Here, the number of wordlines, the number of bitlines, and the number of memory cells MC may be variously changed according to exemplary embodiments. Also, memory cells that are connected to the same wordline may be defined in unit of pages.

Each of a plurality of memory cells MC may include a variable resistor R and a selection device D. Here, the variable resistor R may be referred to as a variable resistor element or a variable resistance material, and the selection device D may be referred to as a switching device.

According to an exemplary embodiment, the variable resistor R may be connected between one of a plurality of bitlines BL0 through BLm and the selection device D, and the selection device D may be connected between the variable resistor R and one of a plurality of wordlines WL0 through WLn. However, the disclosure is not limited thereto, and thus the selection device D may be connected between one of the plurality of bitlines BL0 through BLm and the variable resistor R, and the variable resistor R may be connected between the selection device D and one of the plurality of wordlines WL0 through WLn.

The variable resistor R may be changed into one of a plurality of resistance states due to an applied electrical pulse. According to an exemplary embodiment, the variable resistor R may include a phase-change material whose crystal state changes according to an amount of applied current. As the phase-change material, various types of materials, such as GaSb, InSb, InSe, Sb2Te3, or GeTe where two elements are combined, GeSbTe, GaSeTe, InSbTe, SnSb2Te4, or InSbGe where three elements are combined, AgInSbTe, (GeSn)SbTe, GeSb(SeTe), Te81Ge15Sb2S2 where four elements are combined, etc., may be used.

The phase-change material may have an amorphous state having a relatively high resistance and a crystal state having a relatively low resistance. A phase of the phase-change material may change due to Joule's heat that is generated according to an amount of current. Also, data may be written by using the change in the phase.

According to another exemplary embodiment, the variable resistor R may include perovskite compounds, transition metal oxides, magnetic materials, ferromagnetic materials, or antiferromagnetic materials.

The selection device D may be connected between one of the plurality of wordlines WL0 through WLn and the variable resistor R and control a supply of current to the variable resistor R according to a voltage applied to a wordline and a bitline that are connected to each other. According to an exemplary embodiment, the selection device D may be a PN junction diode or a PIN junction diode, an anode of the diode may be connected to the variable resistor R, and a cathode of the diode may be connected to one of the plurality of wordlines WL0 through WLn. Here, if a voltage difference between the anode and the cathode of the diode becomes higher than a threshold voltage of the diode, the diode may be turned on so as to supply current to the variable resistor R.

According to an exemplary embodiment of the disclosure, a plurality of memory cells may be simultaneously selected in a reading operation performed with respect to the memory cell array 110. For example, memory cells, which are arrayed in an area where a first wordline WL0 crosses first through $m+1^{th}$ bitlines BL0 through BLm, may be selected. A reading operation for determining a first state that is a lowest resistance state will be described as an example. In other words, a few of memory cells having sufficiently low resistance values among memory cells having low resistance states may be determined in low resistance states through a first sensing operation (a coarse sensing operation). In the first sensing operation, at least a few of memory cells corresponding to low resistance states may be temporarily determined in high resistance states due to an increase in a voltage of the first wordline WL0. A second sensing operation (a fine sensing operation) may be selectively performed with respect to other memory cells that are not determined in low resistance states, and the memory cells that are temporarily determined in the high resistance states may be accurately determined in low resistance states through the second sensing operation.

Figure 4A:
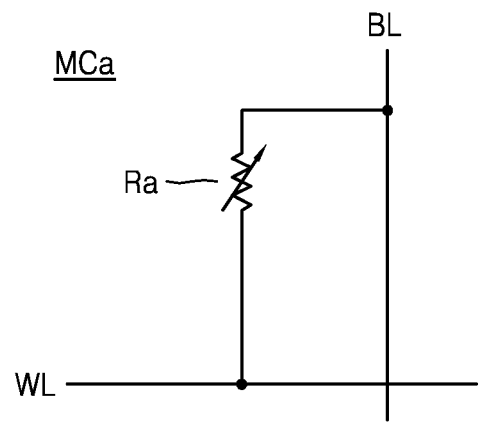
FIGS. 4A through 4C are circuit diagrams illustrating memory cells of FIG. 3, according to exemplary embodiments of the disclosure.
Figure 4B:
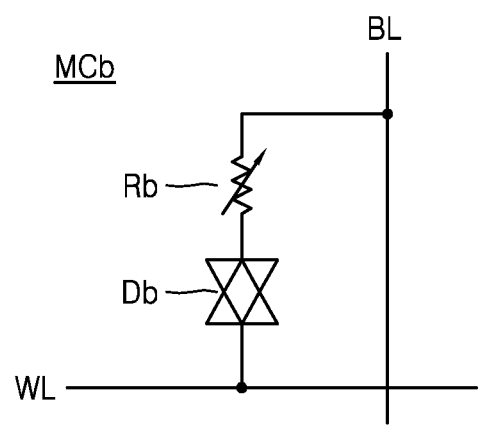
Figure 4C:
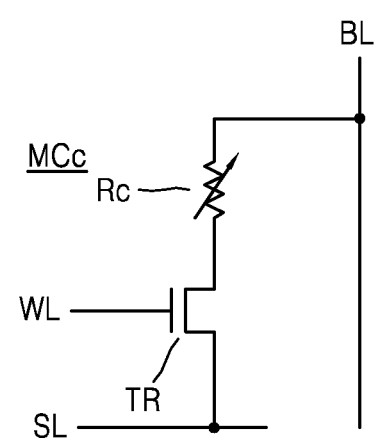

FIGS. 4A through 4C are circuit diagrams illustrating a memory cell of FIG. 3, according to exemplary embodiments of the disclosure.

Referring to FIG. 4A, a memory cell MCa may include a variable resistor Ra, and the variable resistor Ra may be connected between a bitline BL and a wordline WL. The memory cell MCa may store data due to voltages that are respectively applied to the bitline and the wordline.

Referring to FIG. 4B, a memory cell MCb may include a variable resistor Rb and a bidirectional diode Db. The variable resistor Rb may include a resistance material for storing data. The bidirectional diode Db may be connected between the variable resistor Rb and the wordline WL, and the variable resistor Rb may be connected between the bitline BL and the bidirectional diode Db. Positions of the bidirectional diode Db and the variable resistor Rb may be changed with each other. A leakage current that flows in an unselected resistance cell may be interrupted through the bidirectional diode Db.

Referring to FIG. 4C, a memory cell MCc may include a variable resistor Rc and a transistor TR. The transistor TR may be a selection device that supplies a current to the variable resistor Rc or interrupts the supply of the current to the variable resistor Rc according to a voltage of a wordline WL, i.e., may be a switching device. In the exemplary embodiment of FIG. 4C, besides the WL, a source line SL may be additionally included to adjust voltage levels of both ends of the variable resistor Rc. The transistor TR may be connected between the variable resistor Rc and the source line SL, and the variable resistor Rc may be connected between the bitline BL and the transistor TR. Positions of the transistor TR and the variable resistor Rc may be changed with each other. The memory cell MCc may be selected or unselected according to whether the transistor TR driven by the wordline WL is turned on and/or off.

Figure 5:
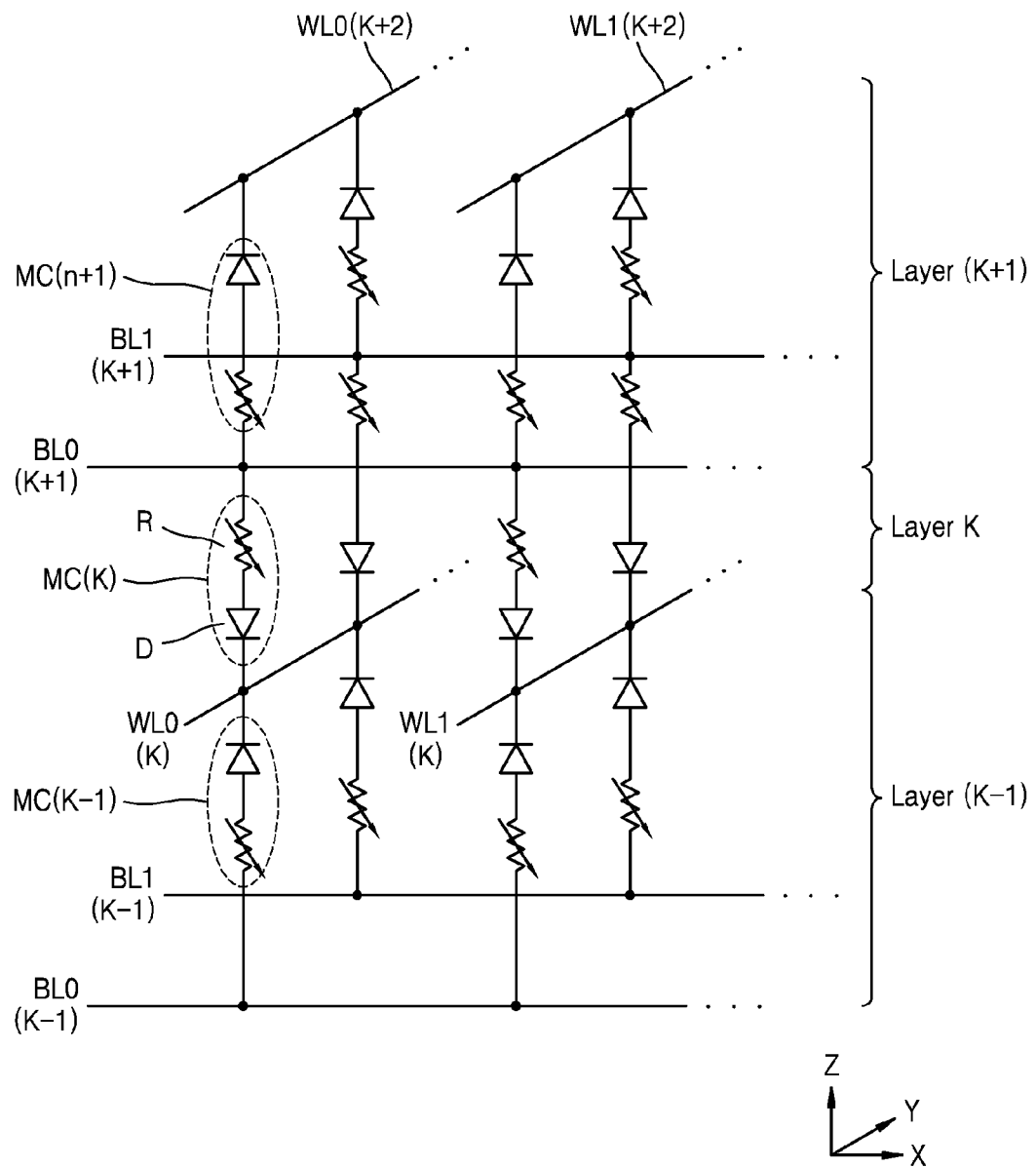
FIG. 5 is a circuit diagram illustrating a memory device including a plurality of layers, according to an exemplary embodiment of the disclosure.

FIG. 5 is a circuit diagram illustrating a memory device that includes a plurality of layers, according to an exemplary embodiment of the disclosure.

Referring to FIG. 5, $K-1^{st}$, $K^{th}$, and $K+1^{st}$ layers may be stacked in one direction, e.g., in a direction perpendicular to a substrate on which the memory cell array 110 is arrayed. The $K-1^{st}$, $K^{th}$, and $K+1^{st}$ layers respectively include a plurality of $K-1^{st}$, $K^{th}$, and $K+1^{th}$ memory cells MC, and wordlines WL0 and WL1 and bitlines BL0 and BL1 may be connected to both ends of the $K-1^{st}$, $K^{th}$, and $K+1^{th}$ memory cells.

According to an exemplary embodiment, adjacent layers may share wordlines and bitlines. For example, the $K^{th}$ layer and the $K+1^{th}$ layer may share bitlines BL0 (K+1) and BL1 (K+1). Also, the $K^{th}$ layer and the $K-1^{st}$ layer may share wordlines WL0 (K) and WL1 (K). In the exemplary embodiment of FIG. 5, layers may share a bitline or a wordline, and one layer may share a wordline or a bitline along with a layer formed on the one layer and a layer formed underneath the one layer, but the disclosure is not limited thereto. According to another exemplary embodiment, one layer and an adjacent layer may share a wordline and a bitline or one layer and another layer that is spaced apart from the one layer may share a wordline or a bitline.

When reading operations are simultaneously performed with respect to a plurality of memory cells, a plurality of memory cells, which are arrayed in an area where a first line (e.g., a wordline) crosses a plurality of second lines (e.g., bitlines), may be selected. In the exemplary embodiment of FIG. 5, a plurality of bitlines BL0 (K–1), BL1 (K–1), . . . and one wordline WL0 (K) may be selected to select a plurality of memory cells that are arrayed on the $K-1^{th}$ layer.

Figure 6:
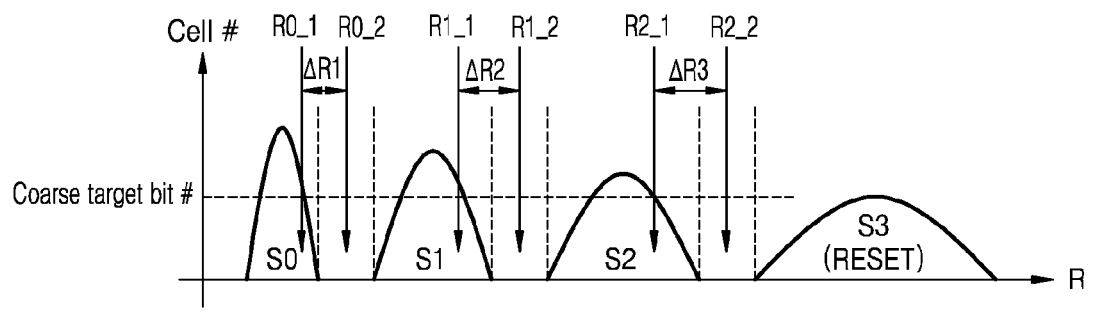
FIG. 6 is a graph illustrating a resistance level dispersion of a multi-level cell, according to an exemplary embodiment of the disclosure.

FIG. 6 is a graph illustrating resistance level distributions of MLCs, according to an exemplary embodiment of the disclosure. As shown in FIG. 6, each of the MLCs stores data of 2 bits, and thus the MLCs may have 4 resistance level distributions.

Also, a horizontal axis denotes a resistance, a vertical axis denotes the number of MLCs, and a resistance level of a first state S0 may have the lowest resistance value. Second through fourth states S1 through S3 may have relatively higher resistance values than the first state S0. The first state S0 may be defined as a set state, and the fourth state S3 may be defined as a reset state.

According to a characteristic of a resistive memory cell, through a verifying operation performed when writing data, a width of a resistance level distribution may narrow, and a width of a resistance level distribution of the set state may be relatively narrower than a width of a resistance level distribution of the reset state. For example, a width of a resistance level dispersion of the first state S0 may be narrowest and may be narrower than widths of resistance level dispersions of the second through fourth states S1 through 3. Therefore, when determining respective states in data reading operations, variations in values of read factors of a plurality of sensing operations for determining the first state S0 may have smaller values than variations in values of read factors of a plurality of sensing operations for determining the second through fourth states S1 through S3.

In detail, in a reading operation for determining the first state S0, a read condition may be set to enable a target resistance to instruct a 1-1$^{st}$ value R0_1 in a first sensing operation. In the first sensing operation, memory cells having resistance values lower than or equal to the 1-1$^{st}$ value R0_1 may be determined in low resistance states. Therefore, a second sensing operation may be selectively performed with respect to other memory cells that are not determined in low resistance states. In the second sensing operation, a value of a read factor may be changed to enable a target resistance to instruct a 1-2$^{nd}$ value Ro_2. A difference between the 1-1$^{st}$ value R0_1 and the 1-2$^{nd}$ R0_2 corresponds to a first variation ΔR1. In the second sensing operation, memory cells having resistance values lower than or equal to the target resistance may be determined to be in low resistance states.

According to a similar method to this, a plurality of sensing operations may be performed to determine the second state S1. In a reading operation for determining the second state S1, a read condition may be set to enable a target resistance to instruct a 2-1$^{st}$ R1_1 in a first sensing operation. In a second sensing operation, a value of a read factor may be changed to enable a target resistance to instruct a 2-2$^{nd}$ value R1_2. A difference between the 2-1$^{st}$ value R1_1 and the 2-2$^{nd}$ value R1_2 corresponds to a second variation ΔR2. The second variation ΔR2 may have a higher value than the first variation ΔR1.

Also, according to a similar method to this, a plurality of sensing operations may be performed to determine the third state S2. In a reading operation for determining the third state S2, a read condition may be set to enable a target resistance to instruct a 3-1$^{st}$ value R2_1 in a first sensing operation. In a second sensing operation, a value of a read factor may be changed to enable a target resistance to instruct a 3-2$^{nd}$ value R2_2. A difference between the 3-1$^{st}$ value R2_1 and the 3-2$^{nd}$ value R2_2 corresponds to a third variation ΔR3. The third variation ΔR3 may have a higher value than the first and second variations ΔR1 and ΔR2.

According to the above-described exemplary embodiment, coarse sensing is performed through a first sensing operation performed to determine respective states. Also, a few of memory cells having low resistances may be first determined in low resistance states among memory cells having low resistance states through the coarse sensing. Thereafter, fine sensing is performed through a second sensing operation, and other memory cells in low resistance states may be determined through the fine sensing. In an opposite description to this, a few of memory cells having high resistances may be first determined in high resistance states among memory cells having high resistance states through coarse sensing. Thereafter, other memory cells having high resistance states may be determined through fine sensing.

Also, to set a read condition for a coarse sensing operation, a value of a read factor may be set to enable the number of memory cells determined in low resistance states in a first sensing operation for determining the first state S0 to be approximately equal to the number of memory cells determined in low resistance states in a first sensing operation for determining the second state S1. Similarly to this, a value of a read factor may be set to enable the number of memory cells determined in the low resistance states in the first sensing operation for determining the first state S0 to be approximately equal to the number of memory cells determined in low resistance states in a first sensing operation for determining the third state S2.

Figure 7:
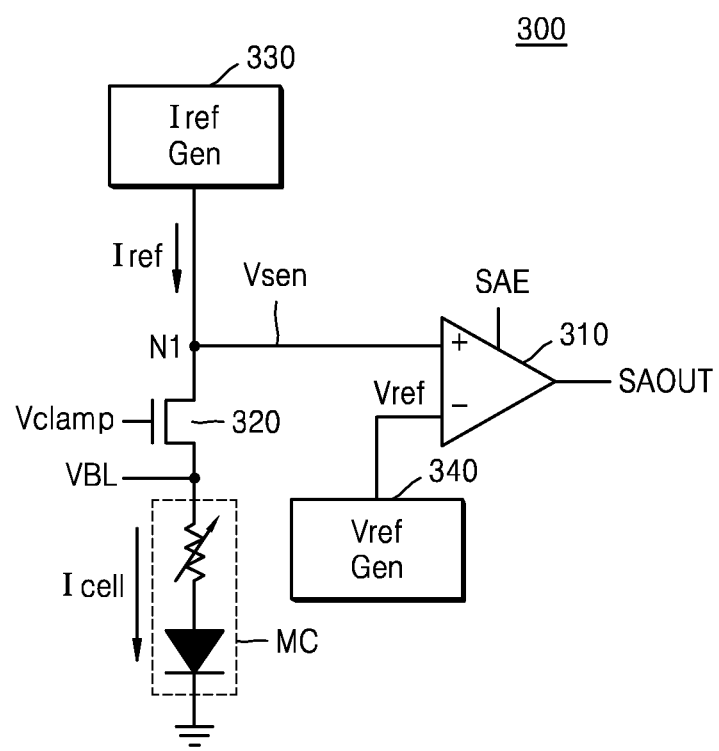
FIG. 7 is a circuit diagram illustrating a data read circuit included in a memory device, according to an exemplary embodiment of the disclosure.

FIG. 7 is a circuit diagram illustrating a data read circuit 300 included in a memory device, according to an exemplary embodiment of the disclosure. The data read circuit 300 may be defined as a concept including various types of peripheral circuits for performing a reading operation with respect to a memory cell. For example, the data read circuit 300 of FIG. 7 is a circuit that determines data according to a current sensing method. Referring to FIG. 7, data is determined according to a method of fixing a bitline to a constant voltage VBL and comparing a current flowing in a memory cell MC with a reference current Iref. Also, since the bitline is fixed to the constant voltage VBL, the current flowing in the memory cell MC varies according to data stored in the memory cell MC.

Referring to FIG. 7, the data read circuit 300 may include a sense amplifier circuit 310, a clamping transistor 320, a reference current generator 330, and a reference voltage generator 340. The sense amplifier circuit 310 is connected to a sensing node N1 corresponding to a node of the memory cells MC. The reference current generator 330 generates the reference current Iref, and the reference voltage generator 340 generates a reference voltage Vref. Function blocks shown in FIG. 7 are an exemplary embodiment, and thus some of the function blocks of FIG. 7 may be excluded to configure the data read circuit 300. Alternatively, besides the function blocks of FIG. 7, additional function blocks may be included in the data read circuit 300.

The sense amplifier circuit 310 may receive a sensing voltage Vsen of the sensing node N1 and the reference voltage Vref and compare the sensing voltage Vsen with the reference voltage Vref to generate an output signal SAOUT. Also, the clamping transistor 320 may be controlled by a clamping signal Vclamp and adjust a level of a voltage (the bitline voltage VBL) of a node of the memory cell MC. The reference current Iref may be provided to the memory cell MC through the clamping transistor 320. The reference current generator 330 that generates the reference current Iref may be realized as various types, for example, may be realized to include a current mirror.

As the bitline voltage VBL has a constant level, a cell current Icell flowing through the memory cell MC may be changed according to a resistance value of a variable resistor. For example, if the resistance value of the variable resistor is high, the cell current Icell having a relatively low level may flow. If the resistance value of the variable resistor is low, the cell current Icell having a relatively high level may flow. If the resistance value of the variable resistor is high, a level of the reference current Iref may be higher than the cell current Icell. If the resistance value of the variable resistor is low, the level of the reference current Iref may be lower than the cell current Icell.

A sensing result may occur according to a comparison result between the reference current Iref and the cell current Icell. For example, if the level of the reference current Iref is higher than the cell current Icell, a voltage level of the sensing node N1 may increase. If the level of the reference current Iref is lower than the cell current Icell, the voltage level of the sensing node N1 may decrease. The sense amplifier circuit 310 may respond to a sensing enable signal SAE to generate the output signal SAOUT having different values according to a comparison result between a level of the sensing voltage Vsen and the level of the reference voltage Vref.

Figure 8:
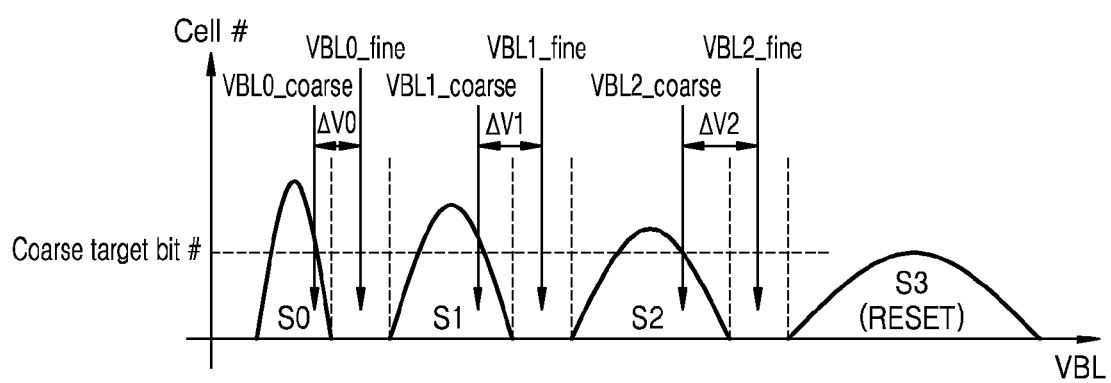
FIGS. 8 through 10 are graphs illustrating variations in a value of a read factor that is applied to the data read circuit of FIG. 7, according to exemplary embodiments of the disclosure.
Figure 9:
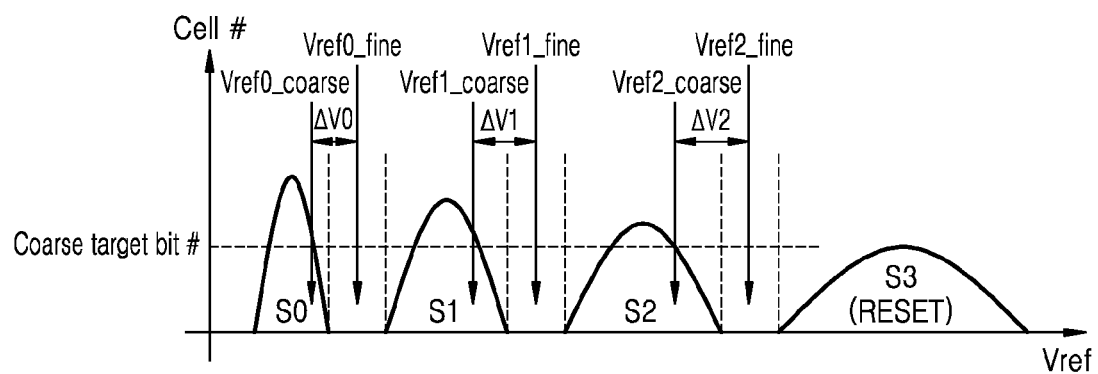
Figure 10:
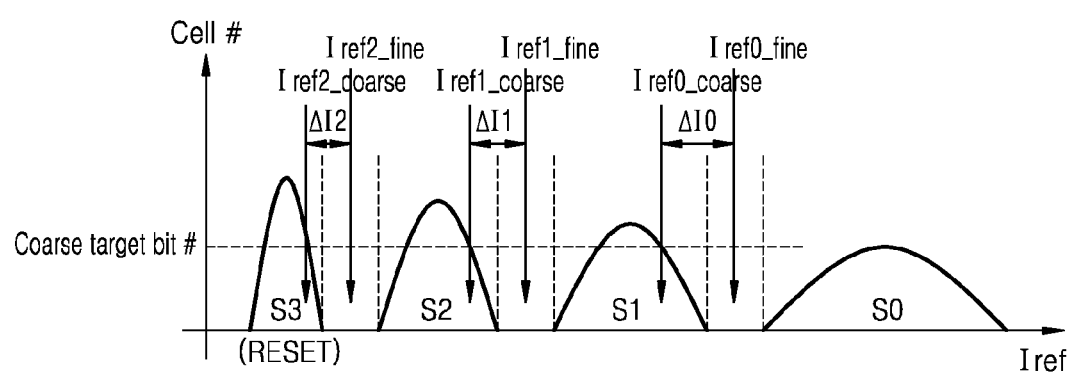

FIGS. 8 through 10 are graphs illustrating variations in a value of a read factor that is applied to the read data circuit 300 of FIG. 7, according to exemplary embodiments of the disclosure. FIG. 8 illustrates variations in a bitline voltage, FIG. 9 illustrates variations in a reference voltage, and FIG. 10 illustrates variations in a reference current. Referring to FIGS. 8 through 10, each of memory cells stores data of 2 bits and thus has 4 resistance level dispersions, and two times sensing operations are performed to determine respective states.

As described above, as a resistance level is high, a width of a threshold voltage distribution may be wide, and the cell current Icell may have a value corresponding to the bitline voltage/the cell resistance VBL/Rcell. In other words, a level of the bitline voltage VBL is proportional to a value of the cell resistance Rcell, and thus a distribution may appear as shown in FIG. 8. A first state S0 indicates a distribution of memory cells having low resistance values, and a fourth state S3 (RESET) indicates a distribution of memory cells having high resistance values.

A plurality of sensing operations may be performed in a reading operation for determining the first state S0, for example, a first sensing operation for coarsely determining a state and a second sensing operation for finely determining a state may be sequentially performed. A coarse sensing operation may be performed by using a first bitline voltage VBL0_coarse in the first sensing operation, and then a fine sensing operation may be performed by using a second bitline voltage VBL0_fine in the second sensing operation. Also, in the first and second sensing operations for determining the first state S0, a variation in a bitline voltage level has a first value $\Delta V0$.

Similarly to this, when determining a second state S1, a coarse sensing operation may be performed by using a third bitline voltage VBL1_coarse in a first sensing operation, and then a fine sensing operation may be performed by using a fourth bitline voltage VBL1_fine in a second sensing operation. In the first and second sensing operations for determining the second state S1, a variation in a bitline voltage level has a second value $\Delta V1$. Also, when determining a third state S2, a coarse sensing operation may be performed by using a fifth bitline voltage VBL2_coarse in a first sensing operation, and then a fine sensing operation may be performed by using a sixth bitline voltage VBL2_fine in a second sensing operation. In the first and second sensing operations for determining the third state S2, a variation in a bitline voltage level has a third value $\Delta V2$.

According to an exemplary embodiment of the disclosure, when changing a level of a bitline voltage VBL as a read factor, the first, second, and third values $\Delta V0$, $\Delta V1$, and $\Delta V2$ may be set to have different values. For example, if a width of a resistance level dispersion is wide with a high resistance value, the first value $\Delta V0$ may be relatively low, and the third value $\Delta V2$ may be relatively high. However, this is an exemplary embodiment, and thus if the width of the resistance level dispersion increases with a low resistance value, the first value $\Delta V0$ may be relatively high.

In FIG. 8, a bitline voltage VBL may be a voltage that is applied to a bitline connected to a memory cell. Alternatively, in FIG. 8, the bitline voltage VBL may indicate a difference between voltages applied to both ends of a memory cell. If a voltage of 0V is applied to a selected wordline, a voltage provided to a bitline of a memory cell may have a level corresponding to the bitline voltage VBL shown in FIG. 8. If a voltage having a different level from 0V is applied to the selected wordline, the voltage provide to the bitline of the memory cell may have a different level from the bitline voltage VBL shown in FIG. 8.

As shown in FIG. 9, if a level of a reference voltage Vref as a read factor is changed, a value of a cell current may decrease and a voltage level of a sensing node may increase with an increase in a resistance value. Therefore, the level of the reference voltage Vref that is compared with the voltage level of the sensing node may also increase. This may indicate that the level of the reference voltage Vref is proportional to the resistance value. In other words, in a distribution as shown in FIG. 9, a first state S0 may indicate a distribution of memory cells having low resistance values, and a fourth state S3 (RESET) may indicate a distribution of memory cells having high resistance values.

When determining the first state S0, a coarse sensing operation may be performed by using a first reference voltage Vref0_coarse in a first sensing operation, and then a fine sensing operation may be performed by using a second reference voltage Vref0_fine in a second sensing operation. In the first and second sensing operations for determining the first state S0, a variation in a reference voltage level Vref has a first value $\Delta V0$.

Similarly to this, when determining a second state S1, a coarse sensing operation may be performed by using a third reference voltage Vref1_coarse in a first sensing operation, and then a fine sensing operation may be performed by using a fourth reference voltage Vref1_fine in a second sensing operation. Also, in the first and second sensing operations for determining the second state S1, a variation in the reference voltage level Vref has a second value $\Delta V1$. When determining a third state S2, a coarse sensing operation may be performed by using a fifth reference voltage Vref2_coarse in a first sensing operation, and then a fine sensing operation may be performed by using sixth reference voltage Vref2_fine in a second sensing operation. In the first and second sensing operations for determining the third state S2, the variation in the reference voltage level Vref has a third value $\Delta V2$. According to an exemplary embodiment, the first, second, and third values $\Delta V0$, $\Delta V1$, and $\Delta V2$ may have different values, for example, the first value $\Delta V0$ may have a relatively low value.

As shown in FIG. 10, if a level of a reference current Iref as a read factor is changed, a value of a current flowing through a memory cell may be low with a high resistance value of the memory cell. Therefore, the level of the reference current Iref that is to be compared with a cell current may also be relatively low. This may indicate that the level of the reference current Iref is inversely proportional to a resistance value. In other words, in a distribution as shown in FIG. 10, a first state S0 may indicate that a distribution of memory cells having low resistance values may be wider.

In a reading operation for determining the first state S0, a coarse sensing operation may be performed by using a first reference current Iref0_coarse in a first sensing operation, and then a fine sensing operation may be performed by using a second reference current Iref0_fine in a second sensing operation. In the first and second sensing operations for determining the first state S0, a variation in a level of the reference current Iref has a first value $\Delta I0$.

Similarly to this, when determining a second state S1, a coarse sensing operation may be performed by using a third reference current Iref1_coarse in a first sensing operation, and then a fine sensing operation may be performed by using a fourth reference current Iref1_fine in a second sensing operation. In the first and second sensing operations for determining the second state S1, the variation in the level of the reference current Iref has a second value $\Delta I1$. When determining a third state S2, a coarse sensing operation may be performed by using a fifth reference current Iref2_coarse in a first sensing operation, and then a fine sensing operation may be performed by using a sixth reference current Iref2_fine in a second sensing operation. In the first and second sensing operations for determining the third state S2, the variation in the level of the reference current Iref has a third value $\Delta I2$.

According to the above-described exemplary embodiment, the first, second, and third values Δl0, Δl1, and Δl2 may have different values. For example, the first value Δl0 may be set to have relatively high value in consideration of a distribution characteristic. In other words, in the above-described exemplary embodiment, a variation in a read factor may be set to have a relatively low value in a sensing operation for determining data having a high resistance value.

Figure 11A:
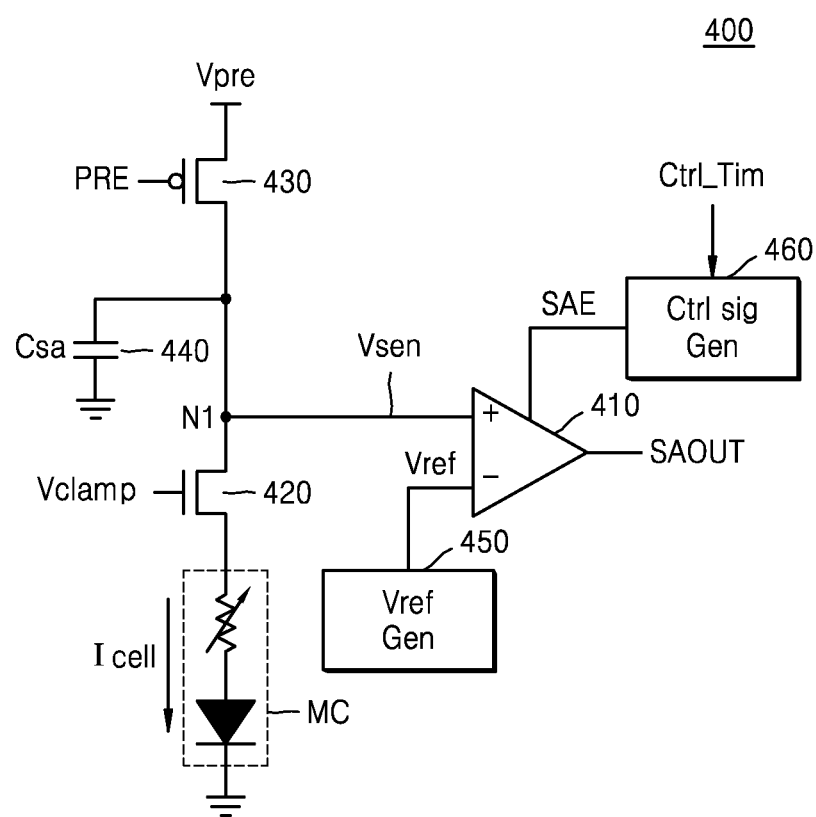
FIGS. 11A and 11B are a circuit diagram and a graph illustrating a data read circuit and sensing enable timing, according to another exemplary embodiment of the disclosure.
Figure 11B:
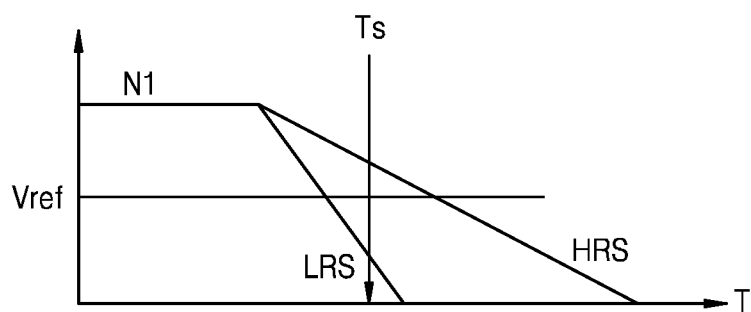

FIGS. 11A and 11B are a circuit diagram and a graph respectively illustrating a data read circuit 400 and a sensing enable timing according to another exemplary embodiment of the disclosure. The data read circuit 400 of FIG. 11A is a circuit that determines data according to a voltage sensing method. As shown in FIG. 11A, the data read circuit 400 may include a sense amplifier circuit 410, a clamping transistor 420, a pre-charge circuit 430, a capacitor Csa 440, and a reference voltage generator 450. The sense amplifier circuit 420 is connected to a sensing node N1 corresponding to a node of a memory cell MC. The clamping transistor 420 adjusts a voltage of the sensing node N1, and the pre-charge circuit 430 pre-charges the sensing node N1 to a preset level. The capacitor Csa 440 is connected to the sensing node N1, and the reference voltage generator 450 generates a reference voltage Vref. Since the data read circuit 400 of FIG. 11A also has a fixed value corresponding to a voltage to which a voltage level applied to a bitline is pre-charged, different cell currents Icell flow according to data stored in the memory cell MC.

The sense amplifier circuit 410 may receive a sensing voltage Vsen of the sensing node N1 and the reference voltage Vref and compare the sensing voltage Vsen with the reference voltage Vref to generate an output signal SAOUT. The sense amplifier circuit 410 may operate in response to a sensing enable signal SAE, and the sensing enable signal SAE may be generated by a control signal generator 460. The control signal generator 460 may control an enable timing of the sensing enable signal SAE in response to a timing control signal Ctrl_Tim. The control signal generator 460 may be separately included in a memory device or may be included in the control logic 130 of FIG. 1.

The clamping transistor 420 may be disposed to adjust a preset amount of a voltage level of the sensing node N1 and may be controlled by a clamping signal Vclamp. Also, the pre-charge circuit 430 may be switched by a pre-charge control signal PRE for a bitline setup fraction to pre-charge the sensing node N1 to a level of a pre-charge voltage Vpre. A voltage charged onto the sensing node N1 may be stored in the capacitor Csa 440.

As a sensing operation starts, the clamping transistor 420 may be turned on, and charges stored in the capacitor 440 may be discharged to a ground node through the memory cell MC. Therefore, the cell current Icell flows through the memory cell MC, and a level of the cell current Icell changes according to a resistance value of the memory cell MC. As shown in FIG. 11B, since the cell current Icell flows through the memory cell MC, a voltage level of the sensing node N1 becomes gradually lower. If a resistance value of the memory cell MC corresponds to a high resistance HRS, the cell current Icell is low, and thus the voltage level of the sensing node N1 becomes lower slowly. If the resistance value of the memory cell MC corresponds to a low resistance LRS, the cell current Icell is high, and thus the voltage level of the sensing node N1 becomes lower quickly. In a voltage reading method, data may be determined according to a comparison result between a level of the sensing voltage Vsen of the sensing node N1 and a level of the reference voltage Vref at an enable timing Ts of the sensing enable signal SAE.

Figure 12:
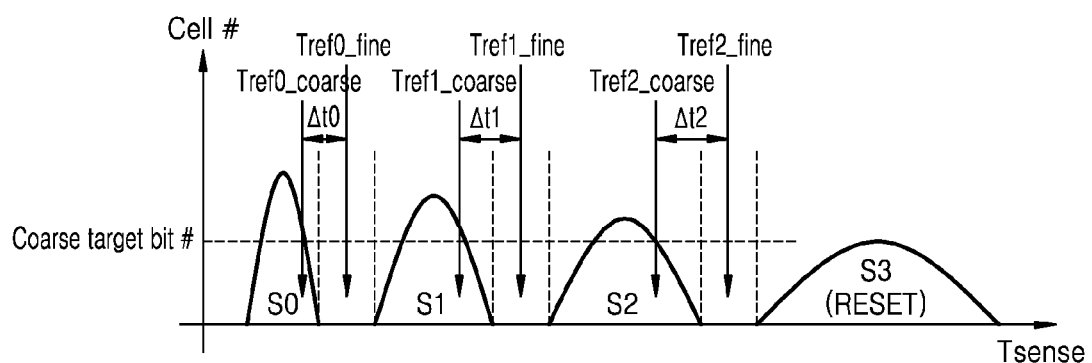
FIGS. 12 and 13 are graphs illustrating changes in a value of a read element that is applied to the data read circuit of FIG. 11, according to an exemplary embodiment of the disclosure.
Figure 13:
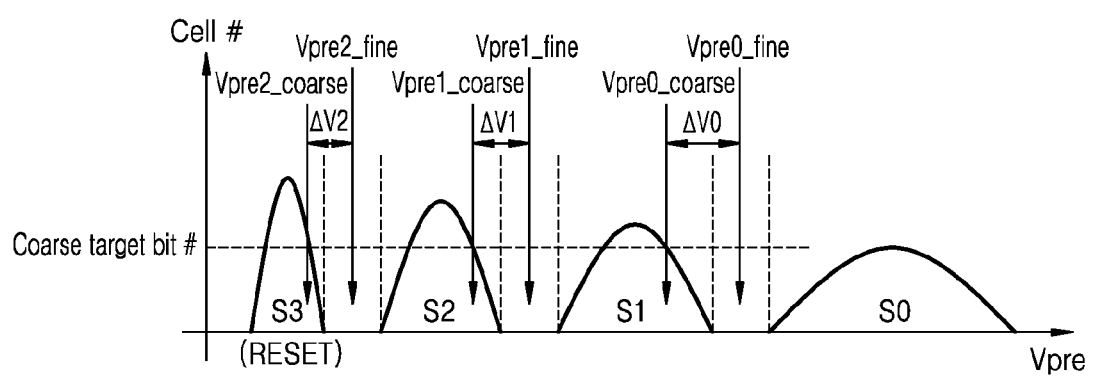

FIGS. 12 and 13 are graphs illustrating variations in a value of a read factor that is applied to the data read circuit 400 of FIG. 11A, according to exemplary embodiments of the disclosure. FIG. 12 illustrates variations in a sensing timing Tsense according to an exemplary embodiment of the disclosure. FIG. 13 illustrates variations in a pre-charge voltage level according to an exemplary embodiment of the disclosure. In FIGS. 12 and 13, each of MLCs stores data of 2 bits and thus has 4 resistance level dispersions, and two sensing operations are performed to determine respective states.

A value of the sensing timing Tsense as a read factor applied to the data read circuit 400 of FIG. 11A may change. The sensing timing Tsense may be a value corresponding to the enable timing Ts of the sensing enable signal SAE provided to the sense amplifier circuit 410. The cell current Icell flowing through the memory cell MC decreases for an increase in a resistance value, and the voltage level of the sensing node N1 becomes lower slowly. Therefore, the sensing timing Tsense grows with the increase in the resistance value, and in a dispersion shown in FIG. 12, a first state S0 may indicate a distribution of memory cells having low resistance values, and a fourth state S3 (RESET) may indicate a distribution of memory cells having high resistance values.

In a reading operation for determining the first state S0, a coarse sensing operation may be performed by using a first sensing timing Tref0_coarse in a first sensing operation, and then a fine sensing operation may be performed by using a second sensing timing Tref0_fine in a second sensing operation. Also, in the first and second sensing operations for determining the first state S0, a variation in a sensing time has a first value Δt0.

Similarly to this, when determining a second state S1, a coarse sensing operation may be performed by using a third sensing timing Tref1_coarse in a first sensing operation, and then a fine sensing operation may be performed by using a fourth sensing timing Tref1_fine in a second sensing operation. In the first and second sensing operations for determining the second state S1, the variation in the sensing timing has a second value Δt1. When determining a third state S2, a coarse sensing operation may be performed by using a fifth sensing time Tref2_coarse in a first sensing operation, and then a fine sensing operation may be performed by using a sixth sensing timing Tref2_fine in a second sensing operation. In the first and second sensing operations for determining the third state S2, the variation in the sensing timing has a third value Δt2. The first, second, and third values Δt0, Δt1, and Δt2 may have different values according to dispersion characteristics of respective states, for example, the third value Δt2 may have a relatively high value.

As shown in FIG. 13, if a level of a pre-charge voltage Vpre as a read factor changes, a value of a current flowing through a memory cell may be low with a high resistance value of the memory cell. Therefore, a voltage level of the sensing node N1 may become lower slowly. Therefore, as the resistance value of the memory cell is high, a voltage level stored in the capacitor 440 may be set to be lowered. Therefore, the level of the pre-charge voltage Vpre may be lowered. In other words, in a distribution as shown in FIG. 13, a distribution of the first state S0 may be illustrated on right side of FIG. 13, and a distribution of memory cells of the first state S0 may be illustrated to be wider.

In a reading operation for determining the first state S0, a coarse sensing operation may be performed by using a first pre-charge voltage Vpre0_coarse in a first sensing operation, and then a fine sensing operation may be performed by using a second pre-charge voltage Vpre1_fine in a second sensing operation. In the first and second sensing operations for determining the first state S0, a variation in a level of the pre-charge Vpre has a first value $\Delta V0$.

Similarly to this, when determining a second state S1, a coarse sensing operation may be performed by using a third pre-charge voltage Vpre1_coarse in a first sensing operation, and then a fine sensing operation may be performed by using a fourth pre-charge voltage Vpre1_fine in a second sensing operation. In the first and second sensing operations for determining the second state S1, the variation in the level of the pre-charge voltage Vpre has a second value $\Delta V1$. When determining a third state S2, a coarse sensing operation may be performed by using a fifth pre-charge voltage Vpre2_coarse in a first sensing operation, and then a fine sensing operation may be performed by using a sixth pre-charge voltage Vpre2_fine in a second sensing operation. In the first and second sensing operations for determining the third state S2, the variation in the level of the pre-charge voltage Vpre has a third value $\Delta V2$.

According to the above-described exemplary embodiment, the first, second, and third values $\Delta V0$, $\Delta V1$, and $\Delta V2$ may have different values, for example, the first value $\Delta V0$ may be set to have a relatively high value in consideration of a dispersion characteristic.

Variations in some of read factors shown in FIG. 11A are illustrated in FIGS. 12 and 13, but the disclosure is not limited thereto. For example, values of different read factors may be set to change in reading operations for reading a plurality of states, for example, values of various types of read factors, such as a clamping signal Vclamp, a pre-charge signal PRE, etc., may change.

Figure 14:
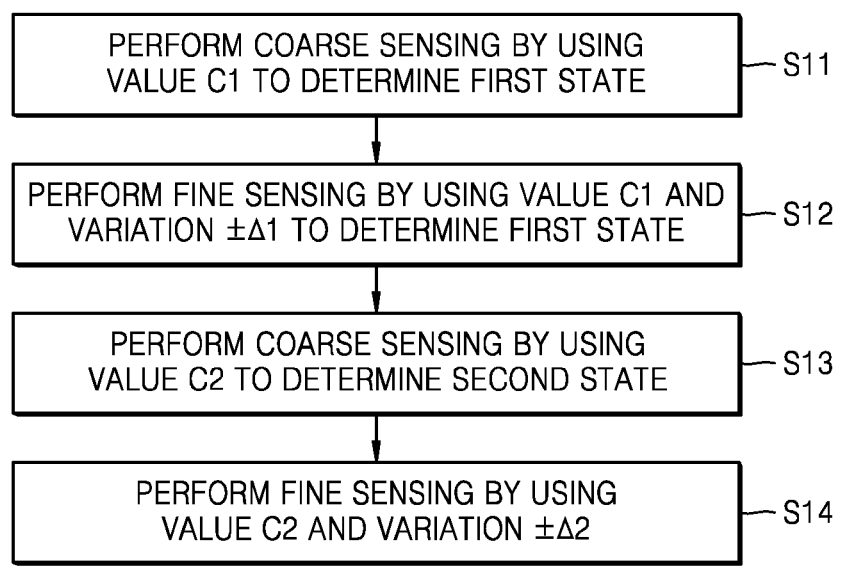
FIG. 14 is a flowchart illustrating a method of operating a memory device according to an exemplary embodiment of the disclosure.

FIG. 14 is a flowchart illustrating a method of operating a memory device according to an exemplary embodiment of the disclosure. The memory device may include a plurality of memory cells that may include MLCs, each of which stores data of 2 bits. The MLCs may have a plurality of resistance level distributions, a first state may be a state having a low resistance value, and a second state may be a state having a high resistance value. Also, a resistance level distribution of the first state having the low resistance value may have a relatively narrow width, and a resistance level distribution of the second state may have a relatively wide width.

A plurality of sensing operations may be performed in a reading operation for determining one state. The plurality of sensing operations may include a first sensing operation for coarsely determining data and a second sensing operation for finely determining data. A plurality of read factors may be used in each of the sensing operations, and a value of at least one read factor may change in each sensing operation equally or similarly to the above-described exemplary embodiment.

For example, in operation S11, a coarse sensing operation is performed with respect to memory cells by using a read factor having a first value C1 in a first reading operation for determining a first state. In operation S12, a fine sensing operation is performed with respect to the memory cells, and a value of a read factor has a variation of $\Delta 1$ in comparison with the first value C1 in a second sensing operation.

As the coarse sensing operation is performed in the first sensing operation, some of selected memory cells having a first state may be normally determined in a first state. As a voltage of a line (e.g., a wordline) commonly connected to the selected memory cells rises, some of the memory cells determined, in the first sensing operation, to have the first state may subsequently be determined to not have the first state. The second sensing operation may be selectively performed with respect to memory cells that are normally determined in the first state.

Equally or similarly to an operation as described above, reading operations for determining different states are performed. For example, a second reading operation for determining a second state may be performed. In operation S13, a coarse sensing operation is performed with respect to memory cells by using a read factor having a second value C2 in the second reading operation. In operation S14, a fine sensing operation is selectively performed with respect to a few of the memory cells in the second reading operation. In the second sensing operation, a value of the read factor has a variation of $\Delta 2$ in comparison with the second value C2.

As in the above-described exemplary embodiment, widths of resistance level dispersions may be different from one another according to respective states. For example, a width of a resistance level distribution corresponding to the first state may be narrower than a width of a resistance level distribution corresponding to the second state. Here, a variation $\Delta 1$ of the read factor for determining the first state may be set to be lower than a variation $\Delta 2$ of the read factor for determining the second state.

Figure 15:
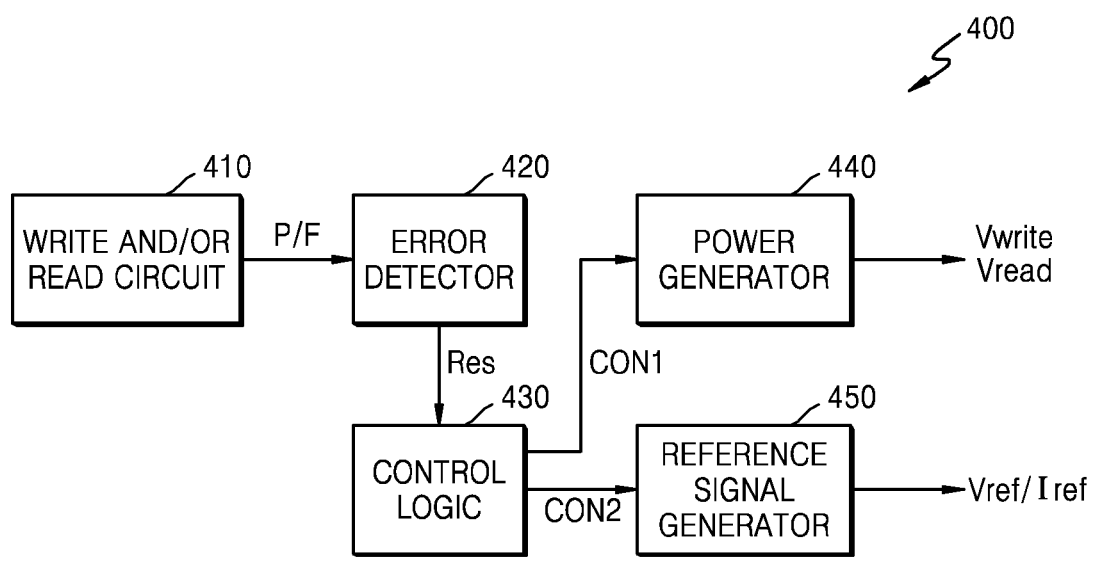
FIG. 15 is a block diagram illustrating a memory device according to another exemplary embodiment of the disclosure.

FIG. 15 is a block diagram illustrating a memory device 400 according to another exemplary embodiment of the disclosure. In FIG. 15, setup information related to a value of a read factor may be adjusted in a normal operation of a memory operation.

As shown in FIG. 15, the memory device 400 may include a write/read circuit 410, an error detector 420, a control logic 430, a power generator 440, and a reference signal generator 450. Besides these elements, the memory device 400 may further include various types of function blocks shown in FIG. 2. The same function blocks of various types of function blocks of FIG. 15 as those of FIG. 2 perform equal or similar operations, and thus their detailed descriptions are omitted.

The write/read circuit 410 may perform writing and reading operations with respect to memory cells of the memory device 400, and the writing and reading operations may be performed under control of the control logic 430. The write/read circuit 410 may perform a reading operation with respect to the memory cells and generate a P/F signal according to the reading result. Also, according to the above-described exemplary embodiment, the write/read circuit 410 may perform at least two sensing operations to determine one state when performing a reading operation, and a value of at least one read factor may change in each of the sensing operations.

The error detector 420 may receive and analyze the P/F signal to detect an error of read data. If the detected error exceeds a preset bit error BER, the error detector 420 may also generate a determination signal Res indicating the excess of the detected error.

The control logic 430 may control the power generator 440 and the reference signal generator 450 based on the determination signal Res received from the error detector 420. For example, if the detected error exceeds the preset bit error BER, values of various types of read factors used in a reading operation may be controlled to change. For this, the control logic 430 may provide various types of control signals CON1 and CON2 to the power generator 440 and the reference signal generator 450. The power generator 440 and the reference signal generator 450 may respectively change and output levels of various types of signals used in a reading operation. For example, the power generator 440 may output a write voltage Vwrite and/or a read voltage Vread, levels of which are adjusted, in response to a first control signal CON1. The reference signal generator 450 may output a reference voltage Vref and/or a reference current Iref, levels of which are adjusted, in response to a second control signal CON2. Although not shown in FIG. 15, values of various types of read factors, such as a sensing timing, a pre-charge voltage, etc., as read factors, may be controlled to be changed.

Figure 16A:
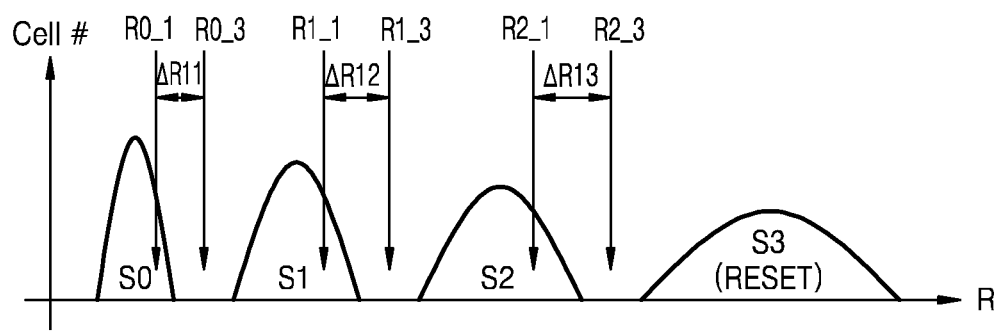
FIGS. 16A and 16B are graphs illustrating changes in a target resistance in a plurality of sensing operations, according to an exemplary embodiment of the disclosure.
Figure 16B:
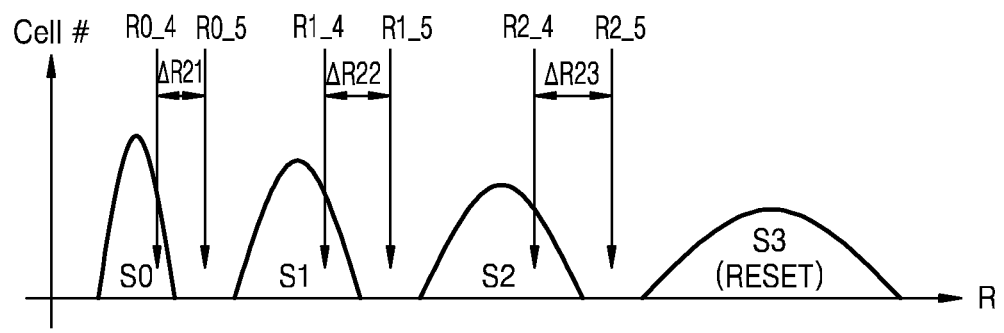

Variations in setups of the read factors will now be described with reference to FIGS. 6, 16A, and 16B. FIGS. 16A and 16B are graphs illustrating variations in a target resistance in a plurality of sensing operations, according to exemplary embodiments of the disclosure. In FIGS. 16A and 16B, each of MLCs may store data of 2 bits, and a width of a resistance level distribution of a reset state S3 (RESET) having a relatively high resistance value may be wide. Also, a sensing operation may be performed according to the graph of FIG. 6, and a value of a read factor may be changed according to the error detection result and the graphs of FIGS. 16A and 16B.

If an occurrence of an error increases in a reading operation, a value of a read factor may be changed to adjust a target resistance so as to reduce the occurrence of the error according to an exemplary embodiment of the disclosure. Also, when changing the value of the read factor, a variation in the value of the read factor may be adjusted according to characteristics of resistance level distributions of respective states.

A plurality of reading operations may be performed to determine a plurality of states, and a plurality of sensing operations (e.g., first and second sensing operations) may be performed to determine respective states. A value of a read factor, which is used in at least one of first and second sensing operations, may be changed according to the error detection result. For example, in FIG. 16A, a value of a read factor used in a second sensing operation is changed.

In detail, in a reading operation for determining a first state S0, a target resistance may keep a $1-1^{st}$ value R0_1 in a first sensing operation and may be changed into a $1-3^{rd}$ value R0_3 in a second sensing operation. Similarly to this, in a reading operation for determining a second state S1, a target resistance may keep a $2-1^{st}$ value R1_1 in a first sensing operation and may be changed into a $2-3^{rd}$ value R1_3 in a second sensing operation. Also, similarly to this, in a reading operation for determining a third state S2, a target resistance may keep a $3-1^{st}$ value R2_1 in a first sensing operation and may be changed into a $3-3^{rd}$ value R2_3 in a second sensing operation.

ΔR11 corresponding to a difference between the $1-1^{st}$ value R0_1 and the $1-3^{rd}$ value R0_3 may have a relatively low value. ΔR12 corresponding to a difference between the $2-1^{st}$ value R1_1 and the $2-3^{rd}$ value R1_3 and ΔR13 corresponding to a difference between the $3-1^{st}$ value R2_1 and the $3-3^{rd}$ value R2_3 may have relatively higher values than ΔR11. Variations in target resistances in second sensing operations of reading operations for determining respective states may be set to be different according to an error detection result. For example, a variation in a target resistance in a second sensing operation of a reading operation for determining a third state S2 may be set to be relatively high.

FIG. 16B illustrates variations in a value of a read factor used in first and second sensing operations. As shown in FIG. 16B, in a reading operation for determining a first state S0, a target resistance may be changed into a $1-4^{th}$ value R0_4 in a first sensing operation and into a $1-5^{th}$ value R0_5 in a second sensing operation. Similarly to this, in a reading operation for determining a second state S1, a target resistance may be changed into a $2-4^{th}$ value R1_4 in a first sensing operation and into a $2-5^{th}$ value R1_5 in a second sensing operation. Also, similarly to this, in a reading operation for determining a third state S2, a target resistance may be changed into a $3-4^{th}$ value R2_4 in a first sensing operation and into a $3-5^{th}$ value R2_5 in a second sensing operation.

ΔR21 corresponding to a difference between the $1-4^{th}$ value R0_4 and the $1-5^{th}$ value R0_5 may have a relatively low value. ΔR22 corresponding to a difference between the $2-4^{th}$ value R1_4 and the $2-5^{th}$ value R1_5 and ΔR23 corresponding to a difference between the $3-4^{th}$ value R2_4 and the $3-5^{th}$ value R2_5 may have relatively higher values than ΔR21. Also, according to the error detection result, a target resistance may be variously changed in first and second sensing operations to minimize an occurrence of an error according to each state.

Figure 17:
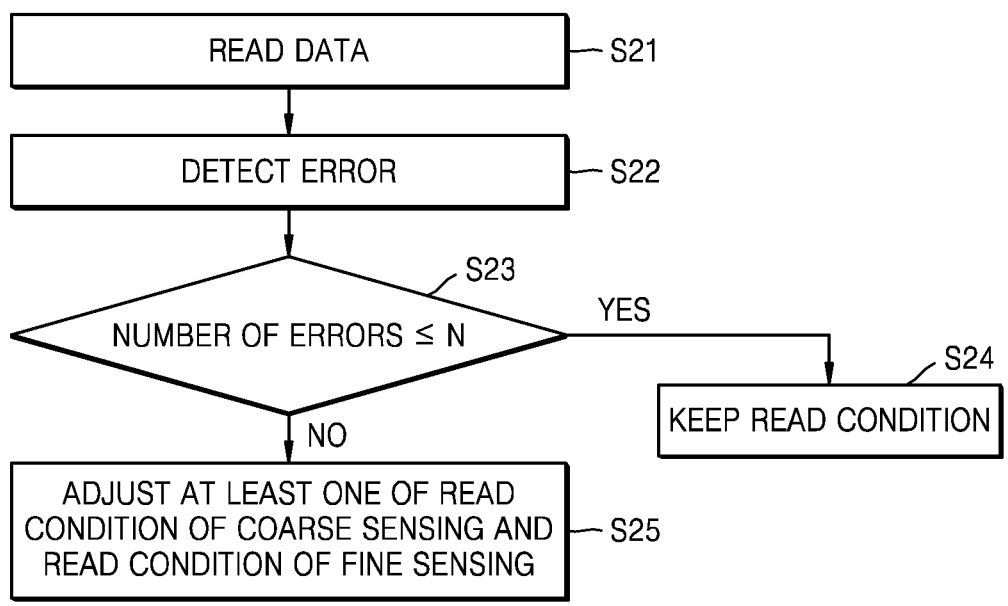
FIG. 17 is a flowchart illustrating a method of operating a memory device, according to another exemplary embodiment of the disclosure.

FIG. 17 is a flowchart illustrating a method of operating a memory device, according to another exemplary embodiment of the disclosure.

Referring to FIG. 17, in operation S21, the memory device performs a data reading operation according to a command of a memory controller. In operation S22, the memory device performs an error detection operation with respect to the read data. In operation S23, the memory device determines whether the number of detected errors is equal to or lower than a preset threshold value, according to the error detection result. If the number of detected errors is equal to or lower than the preset threshold value, the memory device keeps a current read condition without changing a value of a read factor in operation S24.

If the number of detected errors exceeds the preset threshold value, at least one value of a plurality of read factors used in a reading operation may be adjusted, e.g., a value of a read factor may be adjusted. In operation S25, in a reading operation for determining each state, a plurality of sensing operations (e.g., first and second sensing operations) may be performed, and at least one selected from read conditions of the first and second sensing operations may be adjusted. The read condition may be adjusted through a variation in a value of at least one selected from a plurality of read factors used in the reading operation.

Figure 18:
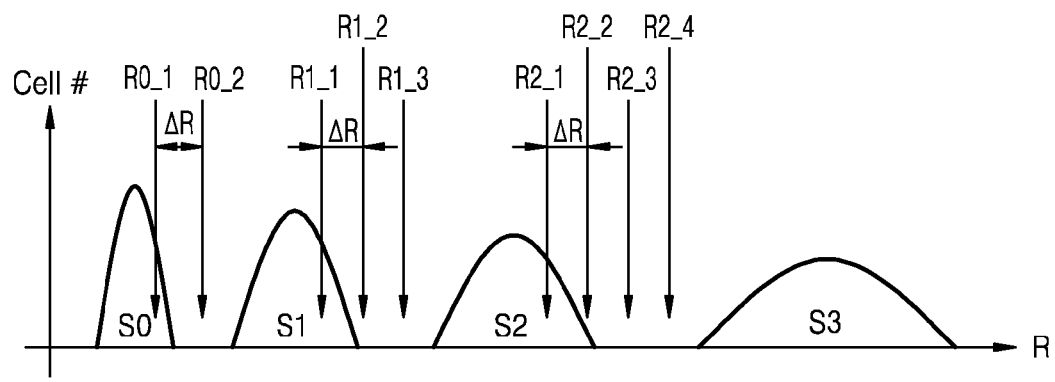
FIGS. 18 and 19 are graphs illustrating changes in a value of a read element, according to another exemplary embodiment of the disclosure.
Figure 19:
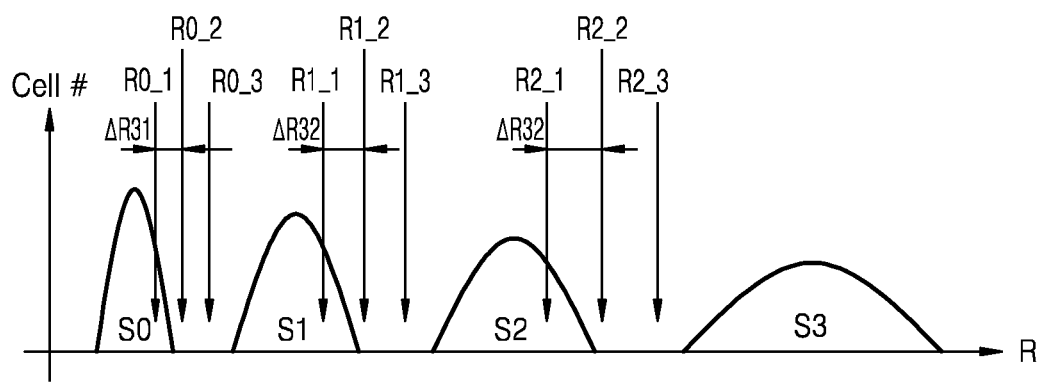

FIGS. 18 and 19 are graphs illustrating variations in a value of a read factor, according to exemplary embodiments of the disclosure. In FIGS. 18 and 19, each of MLCs may store data of 2 bits, and a width of a resistance level distribution of a reset state S3 having a relatively high resistance value may be wide.

The number of sensing operations performed in a reading operation for determining each state may be set to be different. For example, as shown in FIG. 18, two times sensing operations may be performed in a first reading operation for determining a first state S0, three times sensing operations may be performed in a second reading operation for determining a second state S1, and four times sensing operations may be performed in a third reading operation for determining a third state S2. However, this is an exemplary embodiment, and thus the number of sensing operations performed in each reading operation may be variously set.

In the exemplary embodiment shown in FIG. 18, sensing operations may be repeatedly performed, and thus a variation ΔR in a target resistance may be equally set. For example, in a first reading operation, a first sensing operation may be performed by a read factor that instructs a 1-1$^{st}$ target resistance R0_1, and then a second sensing operation may be performed by a read factor that instructs a 1-2$^{nd}$ target resistance R0_2 having an increased variation ΔR.

Similarly to this, in a second reading operation, a first sensing operation may be performed by a read factor that instructs a 2-1$^{st}$ target resistance R1_1, and then a second sensing operation may be performed by a read factor that instructs a 2-2$^{nd}$ target resistance R1_2 having an increased variation. Also, a third sensing operation may be sequentially performed by a read factor that instructs a 2-3$^{rd}$ target resistance R1_3 having an increased variation ΔR. Similarly to this, in a third reading operation, a target resistance may increase by the variation ΔR, and four times sensing operations may be sequentially performed.

According to the exemplary embodiment of FIG. 18, variations in a target resistance may be the same in each sensing operation, and the number of sensing operations performed according to each state may be differently set. Therefore, a difference between values of a lowest target resistance and a highest target resistance for determining a first state S0 may have a relatively low value, but a difference between values of a lowest target resistance and a highest target resistance for determining a third state S2 may have a relatively high value.

In FIG. 19, the number of sensing operations performed according to each state may be equally set, but a variation in a target resistance may be differently set in each sensing operation. As shown in FIG. 19, three times sensing operations may be performed to determine each state. For example, a target resistance may increase by a first variation ΔR31 in a plurality of sensing operations for determining the first state S0, and a target resistance may increase by a second variation ΔR32 in a plurality of sensing operations for determining the second state S1. A target resistance may increase by a third variation ΔR33 in a plurality of sensing operations for determining the third state S2. The first, second, and third variations ΔR31, ΔR32, and ΔR33 may be respectively set in consideration of characteristics of resistance level states, for example, the third variation ΔR33 may have a relatively high value.

Figure 20:
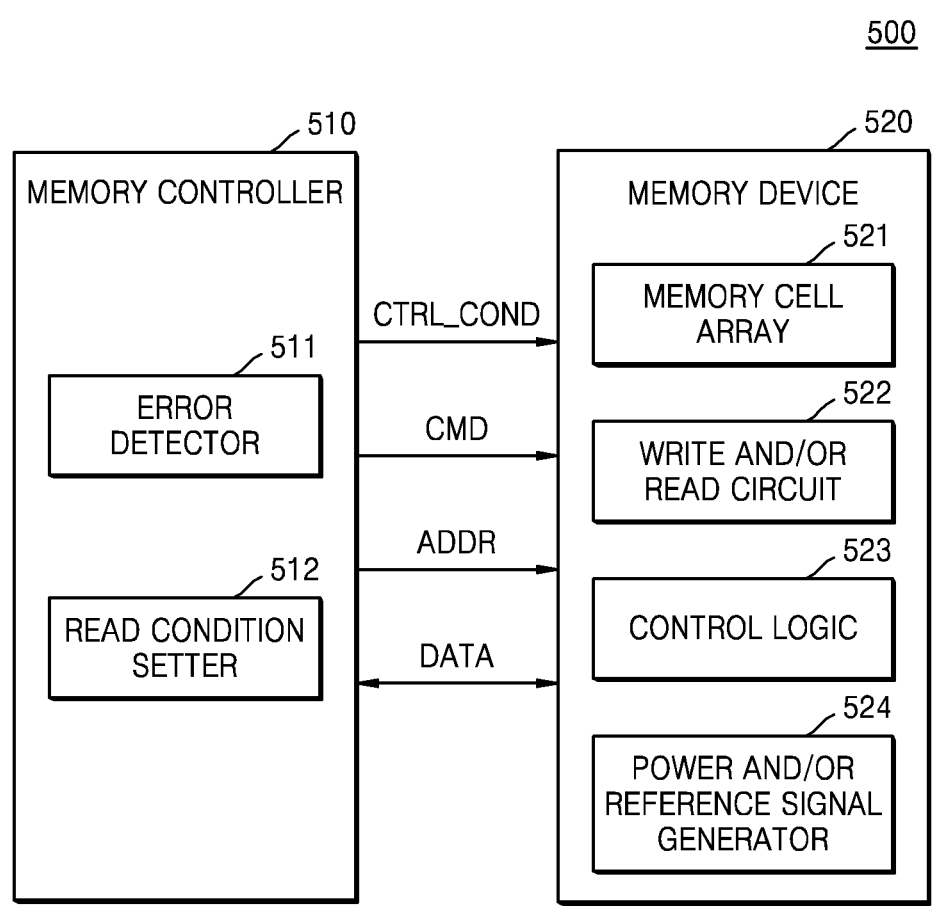
FIG. 20 is a block diagram illustrating a memory system including a memory device, according to another exemplary embodiment of the disclosure.

FIG. 20 is a block diagram illustrating a memory system 500 including a memory device 520, according to an exemplary embodiment of the disclosure.

Referring to FIG. 20, the memory system 500 may include a memory controller 510 and the memory device 520. The memory controller 510 may include an error detector 511 and a read condition setter 512. The memory device 520 may include a memory cell array 521, a write and/or read circuit 522, a control logic 523, and a power and/or reference signal generator 524. If the memory cell array 521 includes resistive memory cells, the memory system 500 may be referred to as a resistive memory system. The same elements of FIG. 20 as those of FIG. 1 or 2 perform equal or similar operations, and thus their detailed descriptions are omitted.

The read condition setter 512 outputs various types of control signals CTRL_COND for setting a read condition to enable the memory device 520 to adjust values of various types of read factors based on the control signals CTRL_COND. For example, the control signals CTRL_COND may include signals for controlling a reference current Iref, a reference voltage Vref, a bitline voltage VBL, a sensing enable signal SAE, a pre-charge voltage Vpre, etc. mentioned in the above-described exemplary embodiment.

The memory device 520 may perform a memory operation in response to an address ADDR and a command CMD received from the memory controller 510 and receive write data DATA from the memory controller 510 or output read data DATA to the memory controller 510. The memory device 520 may also change values of various types of read factors in response to the control signals CTRL_COND. For example, the power and/or reference signal generator 524 may adjust a value of at least one read factor in response to the control signals CTRL_COND. At least one level of various types of power and reference signals as read factors, including the reference current Iref, the reference voltage Vref, the pre-charge voltage Vpre, and the bitline voltage VBL, may be adjusted.

Alternatively, the control logic 523 may generate a sensing enable signal SAE and a pre-charge signal PRE and control an enable timing of the sensing enable signal SAE or adjust an enable width of the pre-charge signal PRE in response to the control signals CTRL_COND. Also, according to the above-described exemplary embodiment, a value of a read factor may be changed in consideration of an error detection result. Therefore, the read condition setter 512 may receive an error detection result from the error detector 511 and generate the control signals CTRL_COND based on the error detection result.

In addition, according to the above-described exemplary embodiment, the read condition setter 512 may generate the control signals CTRL_COND in consideration of characteristics of resistance level dispersions of memory cells. For example, a variation in a target resistance may be highly set in a plurality of sensing operations for determining a state where a width of a resistance level dispersion is relatively wide. Also, a variation in a target resistance may be set to be low in a plurality of sensing operations for determining a state where a width of a resistance level dispersion is relatively narrow.

Figure 21:
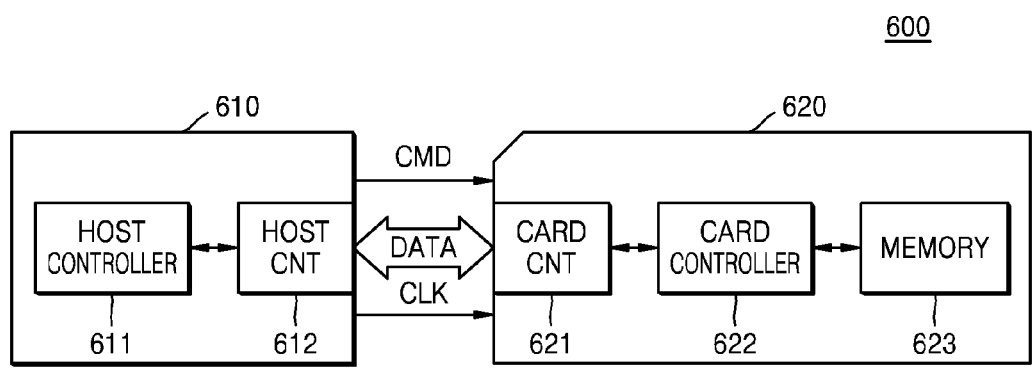
FIG. 21 is a block diagram illustrating a memory system that is applied to a memory card system, according to an exemplary embodiment of the disclosure.

FIG. 21 is a block diagram illustrating a memory card system 600 including a memory system according to an exemplary embodiment of the disclosure. The memory system may be a resistive memory system.

Referring to FIG. 21, the memory card system 600 may include a host 610 and a memory card 620. The host 610 may include a host controller 611 and a host connector 612. The memory card 620 may include a card connector 621, a card controller 622, and a memory device 623. Here, the memory device 623 may be realized according to the exemplary embodiments described with reference to FIGS. 1 through 20. Therefore, coarse sensing and fine sensing may be sequentially performed to determine one state, and variations in values of read factors for performing the coarse and/or fine sensing may be set in consideration of characteristics of resistance level dispersions. When a determination is made that a width of a resistance level dispersion is wide, a variation in a value of the read factor may have a high value.

The host 610 may write data into the memory card 620 or read data from the memory card 620. The host controller 611 may transmit a command CMD, a clock signal CLK generated by a clock generator (not shown) of the host 610, and data DATA to the memory card 620 through the host connector 621.

The card controller 622 may synchronize with a clock signal generated by a clock generator of the card controller 622 to store data in the memory device 623 in response to a command received through the card connector 621. The memory device 623 may store data transmitted from the host 610.

The memory card 620 may be realized as a compact flash card (CFC), a micro-drive, a smart media card (SMC), a multimedia card (MMC), a security digital card (SDC), a memory stick, a universal serial bus (USB) flash memory driver, or the like.

Figure 22:
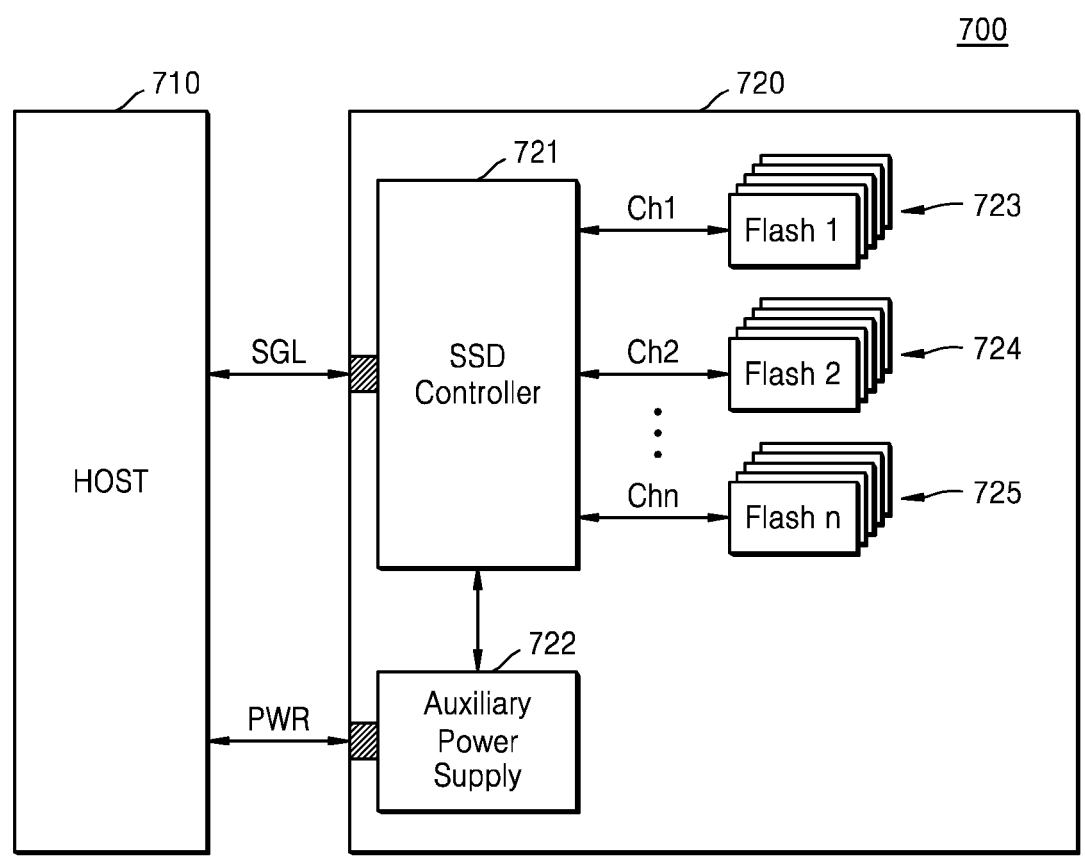
FIG. 22 is a block diagram illustrating a memory system that is applied to a solid state drive (SSD) system, according to an exemplary embodiment of the disclosure.

FIG. 22 is a block diagram illustrating an SSD system 700 including a memory system according to an exemplary embodiment of the disclosure.

Referring to FIG. 22, the SSD system 700 may include a host 710 and an SSD 720. The SSD 720 exchanges a signal SGL with the host 710 through a signal connector and receives power PWR through a power connector. The SSD 720 may include an SSD controller 721, an auxiliary power supply device 722, and a plurality of memory devices 723, 724, and 725. Here, the SSD 720 may be realized according to the exemplary embodiments described with reference to FIGS. 1 through 20. Therefore, the memory devices 723, 724, and 725 may respectively sequentially perform coarse sensing and fine sensing to determine one state, and a variation in a value of a read factor for performing the coarse sensing and/or fine sensing may be set in consideration of a characteristic of a resistance level dispersion. For example, when a determination is made that a width of the resistance level dispersion is wide, the variation in the value of the read factor may have a high value.

Figure 23:
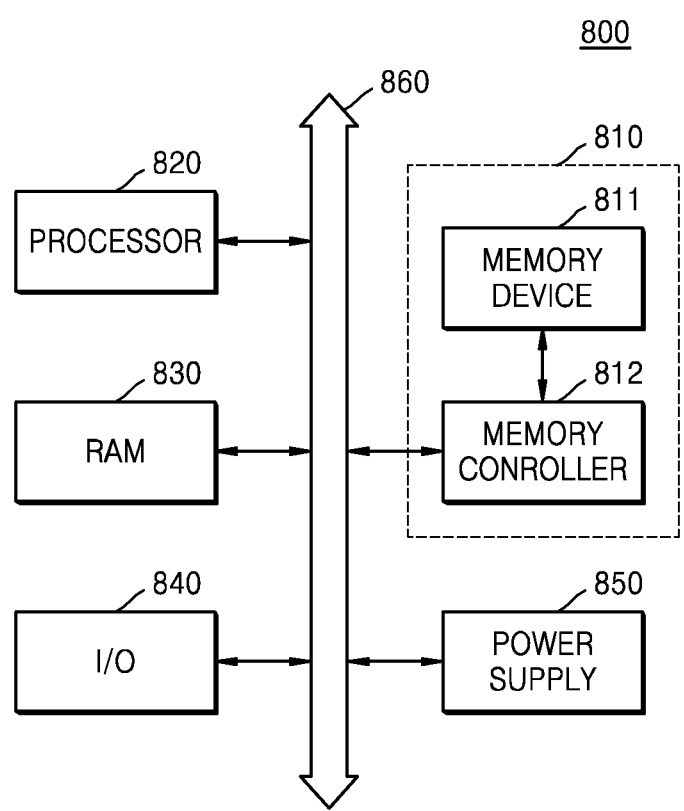
FIG. 23 is a block diagram illustrating a computing system including a memory system according to an exemplary embodiment of the disclosure.

FIG. 23 is a block diagram illustrating a computing system 800 including a memory system 810 according to an exemplary embodiment of the disclosure. The memory system may be a resistive memory system.

Referring to FIG. 23, the computing system 800 may include the memory system 810, a processor 820, a random access memory (RAM) 830, an input/output (I/O) device 840, and a power supply device 850. The memory system 810 may include a memory device 811 and a memory controller 812. Although not shown in FIG. 23, the computing system 800 may further include ports that may communicate with a video card, a sound card, a memory card, a USB device, etc. or may communicate with other electronic devices. The computing system 800 may be realized as a personal computer or as an electronic device such as a notebook computer, a portable phone, a personal digital assistant (PDA), a camera, or the like.

The processor 820 may perform particular calculations or tasks. According to exemplary embodiments, the processor 820 may be a microprocessor or a central processing unit (CPU). The processor 820 may communicate with the RAM 830, the I/O device 840, and the memory system 810 through a bus 860 such as an address bus, a control buss, a data bus, or the like. Here, the memory system 810 and/or the RAM 830 may be realized by using a resistive memory of the exemplary embodiments described with reference to FIGS. 1 through 20.

According to an exemplary embodiment, the processor 820 may be connected to an expansion bus such as a peripheral component interconnect (PCI) bus.

The RAM 830 may store data necessary for an operation of the computing system 800. As described above, the RAM 830 may be a memory device according to an exemplary embodiment of the disclosure. Alternatively, a dynamic RAM (DRAM), a mobile RAM, a static RAM (SRAM), a phase-change RAM (PRAM), a ferroelectric RAM (FRAM), a magnetic RAM (MRAM), or the like may be used as the RAM 830.

The I/O device 840 may include input units, such as a keyboard, a keypad, a mouse, etc., and output units, such as a printer, a display, etc. The power supply device 850 may supply an operation voltage necessary for an operation of the computing system 800.

In a cross-point memory device including MLCs and a method of operating the cross-point memory device according to the disclosure, coarse sensing and fine sensing may be sequentially performed to determine each state. Therefore, even if a consumed current is large in a reading operation, a read performance may be prevented from being deteriorated.

Also, in the cross-point memory device and the method, a best read condition having an improved read performance may be provided to determine an MLC having a plurality of states.

While the disclosure has been particularly shown and described with reference to exemplary embodiments thereof, it will be understood that various changes in form and details may be made therein without departing from the spirit and scope of the following claims.

What is claimed is:

1. A method of operating a cross-point memory device comprising a memory cell array comprising multilevel cells, the method comprising:
    performing a first reading operation with respect to the multilevel cells through a plurality of sensing operations to determine a first state; and
    performing a second reading operation with respect to the multilevel cells through a plurality of sensing operations to determine a second state, wherein
    a difference between a level of a first voltage used in a first sensing operation and a level of a second voltage used in a second sensing operation in the first reading operation is different from a difference between a level of a third voltage used in a first sensing operation and a level of a fourth voltage used in a second sensing operation in the second reading operation.

2. The method of claim 1, wherein the first through fourth voltages respectively indicate potential differences that are applied to both ends of the multilevel cell.

3. The method of claim 1, wherein each of the first through fourth voltages is a voltage that is provided to a bitline connected to the multilevel cells.

4. The method of claim 1, wherein:
    each of the first and second reading operations comprises:
        comparing a voltage of a sensing node generated by data stored in the multilevel cell with a first reference voltage, and
        comparing another voltage of the sensing node generated by the data stored in the multilevel cell with a second reference voltage,
    the first voltage is the first reference voltage of the first reading operation, the second voltage is the second reference voltage of the first reading operation, the third voltage is the first reference voltage of the second reading operation, and the fourth voltage is the second reference voltage of the second reading operation, and
    the first through fourth voltages all have different voltage levels from one another.

5. The method of claim 1, further comprising:
    performing a third reading operation with respect to the multilevel cells through a plurality of sensing operations to determine a third state, wherein
    a difference between a level of a fifth voltage used in a first sensing operation and a level of a sixth voltage used in a second sensing operation in the third reading operation is different from the difference between the levels of the first and second voltages.

6. The method of claim 1, wherein a distribution width of multilevel cells having the first state is relatively narrow, and a distribution width of multilevel cells having the second state is relatively wide.

7. The method of claim 6, wherein:
the second voltage is higher than the first voltage by a first variation, and the fourth voltage is higher than the third voltage by a second variation, and
the first variation is lower than the second variation.

8. The method of claim 1, wherein:
the multilevel cells are arrayed in an area where a plurality of wordlines cross a plurality of bitlines, and
in each of the first and second reading operations, reading is simultaneously performed with respect to multilevel cells that are arrayed in an area where one wordline crosses a plurality of bitlines.

9. The method of claim 8, wherein in the first reading operation, N multilevel cells (wherein N is an integer higher than or equal to 2) are simultaneously sensed through the first sensing operation, and the second sensing operation is selectively performed with respect to multilevel cells that are not determined in the first state in the first sensing operation.

10. The method of claim 1, wherein the number of sensing operations performed in the first reading operation is different from the number of sensing operations performed in the second reading operation.

11. A method of operating a cross-point memory device comprising a memory cell array comprising multilevel cells, the method comprising:
performing a first sensing operation with respect to a plurality of multilevel cells by using a read factor instructing a first target resistance to determine a first state;
performing a second sensing operation with respect to one or more multilevel cells by using the read factor instructing a second target resistance to determine the first state;
performing a third sensing operation with respect to a plurality of multilevel cells by using the read factor instructing a third target resistance to determine a second state; and
performing a fourth sensing operation with respect to one or more multilevel cells by using the read factor instructing a fourth target resistance to determine the second state, wherein
a first resistance difference between the first and second target resistances is different from a second resistance difference between the third and fourth target resistances.

12. The method of claim 11, wherein:
a distribution width of multilevel cells having the first state is relatively narrow, and a distribution width of multilevel cells having the second state is relatively wide, and
the second resistance difference is greater than the first resistance difference.

13. The method of claim 12, wherein the read factor indicates a potential difference that is applied to both ends of each of the multilevel cells.

14. The method of claim 12, wherein the read factor is one of a reference voltage and a reference current that are used in a sensing operation.

15. The method of claim 12, wherein the read factor is a sensing timing indicating an enable timing of a sense amplifier circuit that compares a voltage of a sensing node with a reference voltage.

16. The method of claim 11, further comprising:
determining the number of errors detected from read data; and
changing a value of at least one selected from the first through fourth target resistances according to the determination result.

17. A method of operating a memory system comprising a cross-point memory device and a memory controller, the method comprising:
setting first and second read conditions used in a first reading operation for determining a first state; and
setting third and fourth read conditions used in a second reading operation for determining a second state, wherein
a first variation corresponding to a difference between a value of a read factor of the first read condition and a value of a read factor of the second read condition is different from a second variation corresponding to a difference between a value of a read factor of the third read condition and a value of a read factor of the fourth read condition.

18. The method of claim 17, further comprising:
performing a first sensing operation with respect to a plurality of multilevel cells by using the first read condition; and
selectively performing a second sensing operation with respect to other multilevel cells except multilevel cells determined in the first state through the first sensing operation, by using the second read condition.

19. The method of claim 18, further comprising:
performing a third sensing operation with respect to a plurality of multilevel cells by using the third read condition; and
selectively performing a fourth sensing operation with respect to other multilevel cells except multilevel cells determined in the second state through the third sensing operation, by using the fourth read condition.

20. The method of claim 17, wherein values of the first and second variations are respectively set according to widths of resistance level distributions of the first and second states.

* * * * *